(12) United States Patent
Solomon

(10) Patent No.: US 8,472,230 B2
(45) Date of Patent: Jun. 25, 2013

(54) SELECTIVE ACCESS MEMORY CIRCUIT

(76) Inventor: Neal Solomon, Oakland, CA (US)

( * ) Notice: Subject to any disclaimer, the term of this patent is extended or adjusted under 35 U.S.C. 154(b) by 148 days.

(21) Appl. No.: 12/932,040

(22) Filed: Feb. 16, 2011

(65) Prior Publication Data

US 2011/0199805 A1    Aug. 18, 2011

Related U.S. Application Data

(60) Provisional application No. 61/338,249, filed on Feb. 16, 2010.

(51) Int. Cl.
*G11C 5/06* (2006.01)
*G11C 11/00* (2006.01)

(52) U.S. Cl.
USPC .............................. 365/63; 365/129

(58) Field of Classification Search
USPC .................................................... 365/63, 129
See application file for complete search history.

(56) References Cited

U.S. PATENT DOCUMENTS 8,042,082 B2 * 10/2011 Solomon ....................... 365/129

* cited by examiner

*Primary Examiner* — Trong Phan

(57) ABSTRACT

A selective access memory circuit (SAMC) is described. The SAMC is a class of complex programmable memory device (CPMD) that reconfigures access to memory cells by using gates in an integrated gate array mechanism configured at regular intervals in memory arrays. CPMDs are applied to embedded controllers, microprocessors, DSPs and system on chip (SoC) circuit architectures.

17 Claims, 35 Drawing Sheets

(I)

(II)

(III)

(IV)

(I)

(II)

(III)

|   | A | B | C | D | E | F | G | H | I | J |
|---|---|---|---|---|---|---|---|---|---|---|
| 1 | | | | | | | | | | |
| 2 | | | | | | | | | | |
| 3 | | | | | | | | | | |
| 4 | | | | | | | | | | |
| 5 | | | | | | | | | | |
| 6 | | | | | | | | | | |
| 7 | | | | | | | | | | |
| 8 | | | | | | | | | | |
| 9 | | | | | | | | | | |
| 10 | | | | | | | | | | |

| | Phase I | Phase II |
|---|---|---|
| 1. | A 1 → D 2 | D 2 → I 4 |
| 2. | E 1 → G 4 | G 4 → A 2 |
| 3. | B 6 → H 9 | H 9 → G 6 |
| 4. | I 8 → C 5 | C 5 → E 8 |
| 5. | J 3 → F 1 | F 1 → F 10 |

3000

(I)

(II)

(I)

(II)

(III)

(I)

(II)

(III)

(I)

(II)

SELECTIVE ACCESS MEMORY CIRCUIT

CROSS-REFERENCES TO RELATED APPLICATIONS

The present application claims the benefit of priority under 35 U.S.C. §119 from U.S. Provisional Patent Application Ser. No. 61/338,249, filed Feb. 16, 2010, the disclosure of which is hereby incorporated by reference in their entirety for all purposes.

FIELD OF INVENTION

The present invention relates to programmable and reprogrammable memory devices. The invention involves modulating memory circuitry to allow selective data storage and access to memory cell locations. The invention also relates to multi-layer three dimensional (3D) integrated circuit devices, to active storage memory devices and to hybrid devices that contain CPMD components.

BACKGROUND OF THE INVENTION

Memory circuits, whether RAM, DRAM, SRAM or flash memory devices (and derivatives), are passive. Memory devices are essentially arrays of passive memory cells that store data from and retrieve data to a logic device. However, logic devices are typically used for specific applications. The memory components used in integrated circuits are largely inflexible and error-prone. Further, when a virus strikes a circuit, since the memory component is passive and static, the whole memory array is easily infected, thereby harming the logic circuit as well.

So far, earlier approaches have been limited to field-programmable memory built-in self-test (BIST) controller architecture models. These BIST models use algorithms to test a deterministic sequence of memory and are specifically designed to assist in testing memory defects. The programmable controller of a BIST system is only limited to diagnostic assessment of memory components and is thus both applied to passive memory circuits and narrow applications. These BIST systems apply merely inflexible pre-selected diagnostic algorithms to passive memory devices. They are not active and do not actively limit defective memory cell regions. These approaches do not actively modify memory configurations.

Field programmable memory devices exist. U.S. Pat. No. 5,914,906 describes a field programmable memory array consisting of memory sub-arrays and programmable features. However, this model does not change the configurability of the device like a field programmable gate array device. U.S. Pat. No. 6,501,111 specifies a three dimensional programmable device but the programmable memory features do not change their configuration but are merely programmed like a microprocessor. U.S. Pat. No. 7,160,761 describes a multilayer programmable nonvolatile memory device uses programmable features only to change the memory location of data, not to change the structure of the arrays in the memory device. The present invention advances the art.

SUMMARY OF THE INVENTION

A selective access memory circuit (SAMC) is an integrated circuit that contains a set of gates at specific junctions of memory arrays that, when activated, limit storage and access to specific memory cells. While an SAMC does not change the configuration of fixed memory chambers and arrays, by using the gate configuration, they are able to modulate the use of memory cells.

One benefit of the SAMC is to actively isolate and close off defects that are identified by the diagnostic BIST algorithms. In addition to defects, errors that are identified by diagnostic procedures and sensor components are closed off from data storage and access functionality.

In addition to limiting storage by condoning off defective and error-prone memory cell regions, the problem of security suggests that viruses may infect specific memory regions and require data cell isolation. Once identified, these regions may be closed off from data retrieval and further data storage in the near-term until they may be cleaned, corrected and reopened for later use. The present system allows a memory circuit to segregate storage compartments.

Further, implementations of the present invention are active. Rather than behave as a simple passive memory analysis with pre-determined algorithms, the present system actively repositions components by using a gate array mechanism that cordons off specific sections of each memory array.

There are several implementations of the present invention. In the first implementation, the invention consists of a SAMC, which uses the gate array mechanism and deterministic algorithms to open and close specific memory cells at regular intervals. Each SAMC is manufactured to specifications with different gate array granularity.

In the second implementation, the SAMC is programmable. These complex programmable memory devices (CPMDs) are custom configured to solve different classes of optimization problems. Each device type is configured during the production process to apply to specific applications and is customized to solve each problem type. One may be customized to solve DSP problems and another to solve embedded controller problems.

In a third implementation, the CPMDs are reconfigurable. In this mode, the gate array mechanisms of the reprogrammable CPMDs (R-CPMDs) are able to continually modify the memory architecture in order to satisfy multiple applications, whether simultaneously or at different times.

The SAMCs, CPMDs and R-CPMDs are implemented as (a) multi-layer circuits, (b) active storage memory devices, (c) modular circuits that are combined and (d) devices that reposition data in complex data flows. The three dimensional (3D) circuit implementation of these complex memory devices are implemented with, and integrated into, multi-layer integrated circuits that may include logic components. The active storage memory implementation involves embedding a logic controller into a memory device. The modular circuits are combined in different configurations that are networked in the same location and at different locations. The R-CPMDs use intellectual property (IP) cores using complex third-party algorithms to perform sophisticated data flow processes that are tailored to specific applications.

In one implementation, when CPMDs are combined with CPLDs, such as FPGAs, the interaction of the devices is dynamic. The algorithms to optimize the logic and memory component integration continually reconfigure the devices to maximize the solutions to complex problems. These complex devices produce evolutionary adaptation that constitutes plasticity in intelligent systems.

The present invention uses as an analogy the lattice structure of chemicals. A shift in chemical structure occurs when a change in variable conditions, such as temperature or electric charge, changes. A chemical composition may change from a solid state to a liquid state to a solid state when the conditions change.

The present invention draws from research in CPLDs, and particularly reprogrammable FPGAs. In the case of FPGAs, the logic circuits change from one ASIC position to another ASIC position. In the present case, the storage compartment configurations of a memory device are able to modify. In the case of the SAMCs and CPMDs, structural change is necessary to solve different optimization problems simultaneously.

CPMDs represent a new class of evolvable hardware.

INNOVATIONS OF THE INVENTION

In order to limit errors and prevent viruses from spreading, memory devices need to increase flexibility and efficiency. Further, in order to optimize efficiency of numerous applications, it is necessary to design flexible, and evolvable, memory circuit architectures.

While complex programmable logic devices solve problems involving multiple applications in a single device, memory component architectures have not evolved at the same rate. Yet, there are benefits to development of novel memory devices that are able to maximize flexibility and efficiency of integrated circuit applications.

Given the large increases in memory storage demand, there is a clear need for adaptive, and scalable, memory devices.

ADVANTAGES OF THE INVENTION

There are several advantages of the present invention. First, the SAMC and CPMD architectures allow continual flexibility, maximize system efficiency and protect specific memory regions from erasure.

The efficiency maximization of the present invention, by implementing both optimization algorithms for data flows and gate array mechanisms for constraining data storage and access to specific memory cells, has the effect of efficiently increasing power savings appreciably. In this case, the system only uses the memory that it needs and does not waste its energy or time to use the whole memory device at once.

Further, by isolating specific regions that are not fully operational from the memory device, a single monolithic memory circuit will behave like multiple memory chips.

The SAMC and CPMD approaches allow the memory compartments to be used for different purposes, i.e., for storage of different data sets at different times. The selective memory storage functions that result from modified gate program execution benefit efficiency and security features.

Moreover, in the reprogrammable mode, the memory arrays that use programmable memory architectures continually reconfigure memory arrays, thereby optimizing the circuit for different applications.

When coupled with SoCs, the SAMC and CPMD architectures that comprise the present invention are upgradeable. So far, the SoCs have prominent logic components but generally passive memory components. The main bottleneck has been in memory circuitry.

Because SAMCs and CPMDs are upgradeable, they allow SoC upgradability. This coupled upgradability of complex memory and logic components allows a modular integrated circuit system that tends to allow reconfigurability and prevent obsolescence. When CPMDs are coupled with programmable logic devices or with SoCs, the performance of the logic device is optimized, the flexibility is improved and the efficiency is maximized. Once computational economy is preserved using SAMC and CPMD architectures, device power is preserved.

By using the present invention in its different main embodiments, the SAMC and CPMD circuit architectures are able to solve multiple multi-objective optimization problems simultaneously.

SUMMARY OF THE EMBODIMENTS

The present invention is described in several aspects. First, the SAMC is described. Second, the CPMD is described. Third, the reprogrammable CPMD is described. These three apparatus architectures are then shown in several implementations. The three-dimensional implementation of the devices is described. The active memory implementation is described. In active memory systems, a logic controller is embedded into the memory device. Finally, the SAMC and CPMD circuit types are shown in modular form. Once these main apparatuses and implementations are shown, the invention describes the main embodiments of the SAMC process and the R-CPMD operation.

DESCRIPTION OF THE MAIN EMBODIMENTS

Selective Access Memory Circuit

There are several main reasons to close memory cells. First, some cells are closed for cleaning. Second, some cells are closed to lock in data to storage, so as to prevent later storage, but allowing retrieval. Third, some cells are closed to restrict data retrieval access, e.g., for security. Fourth, some cells are closed to limit damage, for instance, from a virus. Fifth, some cells are closed save energy. Finally, some cells are closed to allow data to move to different locations. Some of these reasons to close memory cells are temporary. In the case of a requirement to temporarily close a memory cell, or set of memory cells, the memory circuit may be pre-programmed or custom programmed at the factory so that users may set up and control the temporary closing of cells.

Complex programmable memory devices (CPMDs) are pre-programmed to close specific cells based on specific criteria. In this implementation of the present invention, the SAMC is a type of CMPD. The SAMC comes from the factory with gates positioned at regular intervals in each memory type.

In one embodiment, the gates are mechanical. They retract after a signal is sent from a logic controller. A sensor sends a signal to the controller about each gate's position.

In another embodiment, the gates are electronic. In this mode, the electronic gates are positioned at key junctions. A logic controller activates the electronic gate to open or close. This is be done by withdrawing energy to the electronic gate to close off the junction and access to the memory cells. Restoring power to the electronic gate restores access to the memory cells.

Specific memory sections are segmented for different applications. This approach provides different priorities for memory compartments to bias for specific differentiated applications.

There are different versions of SAMCs based on the specific bias of differentiated memory gate structures wherein gates are located at specific junctions based on its unique granularity. In some applications, the memory partitions are fine grained and for others course grained. In the case of fine grained partitions, there is increased control in smaller compartments. In the programmable memory implementation of the SAMC, then, the pre-programmed control of gates is structured for specific memory storage functions. However, there are several main classes of SAMC based on the lattice structure and gate position architectures.

The gate apparatus structure is integrated into the memory array structure at different positions. At specific junctions, the gate apparatus structure selectively activates a gate to perform the function of stopping entry of storage and/or retrieval of data into a specific set of memory cells.

In another embodiment, the gate apparatus structure is organized in a separate layer on top of (or under) the memory cell apparatus layer. In this embodiment, the gates retract into the memory layer. The gates use through silicon vias (TSVs) that create holes in the memory layer. The gates are injected into the TSV to perform the blocking function at specific junctions of memory cell arrays.

While the parts of the memory array on one side of the gate are blocked from data storage and/or access to the affected cell sites, the remainder of the memory is fully operational and accessible.

Further, since the gates are flexible, they may be retracted from the closed position upon activation by the controller. Once retracted, the memory flows to the affected cell sites return to fully operational capability. Therefore, the gates in the programmable SAMC are in a fixed position and turn the memory storage cell sites on and off based on their position.

In one configuration of the SAMC, the gate apparatus system allows the storage of data but not the retrieval of the data. In another configuration, the gate apparatus system allows neither storage nor access. Once a specific gate junction is activated, its position is identified by a sensor, which notifies the affected cell array to provide locked storage only, locked storage and access, or locked access only.

Once the controller that activates the gate array assembly is activated with a code provided by the user, the specific memory cell regions are programmed to either store data, lock data for storage and/or access or access data.

The application of this model for memory security at the memory cell array level is useful to maximize privacy at the request of the customer. Code based gate array SAMC solutions to privacy are useful and novel.

In addition to using the programmable SAMC to activate gate array mechanisms to close memory cell arrays at specific junctions, the system is useful to close one memory section and then transfer some or all of the data from that section. This periodic repositioning of data allows the memory device to have sections that are erased, cleaned or repaired. Once erased, cleaned or repaired, the gate mechanism opens at the junction, thereby allowing data flows to return to storage at specific memory cells.

The periodic repositioning of data is analogized to moving furniture from one room in order to clean a floor and paint the room. Once cleaned and painted, the furniture is returned to the original room.

The reorganization of data sets using the present invention has a set of benefits. Once specific cell sites are closed off, the data from these sites may be moved to other sites. However, when storing data in the device once the gates constrain the specific cell sites, new data storage is available only in open data cell arrays. The memory circuit algorithms accommodate the specified closed sites. However, given the limited available storage, the storage algorithm makes an increasingly efficient use of the available space. This is similar to having only five theatres available to show films in a fifteen theatre complex; there are fewer available options thereby increasing the efficiency of the available options.

In one embodiment of the invention, since specific memory cell arrays are closed off by gates at specific junctions, the SAMC features more than one pathway of access to specific cell sites. Without multi-path access to cell sites, closed off junctions are impenetrable. This model is mainly consistent with fine grained programmable SAMCs in which specific cells are closed off from access so as to allow other cells in the same array to be used for storage and/or access at the same time. Without allowing a multi-path approach, these useful cells would be closed off as well. The invention therefore designs SAMCs in grid configuration to allow access to some cell arrays when specific cells are closed.

The CPMD system is particularly useful for changing part of a CPMD circuit while other parts are fully operational. In this model, one or more components of the CPMD will go offline while the device operates. The memory cells that are closed off may be cleaned and repaired while the rest of the circuit is receiving, storing and accessing data in open memory cells. In this case, the data sets are resituated. When the memory cells that are closed off are fully operational, they may be restored. At a later time, other cells are brought offline for cleaning and repair. In this way, the CPMD is self-restoring. The multiple simultaneous action of the circuit allows multi-functional capabilities and a periodic renewal of the memory system.

Data are required to be moved from memory cells periodically. When data are moved from one cell to another in order to preserve data integrity, the system tracks where the data are stored. After the memory cells that are closed are restored, the data may be returned to the restored memory cells or new data may be added to the restored memory cells. Moving data from one compartment to another involves a "shift". Once the data are moved from one memory cell array, the memory cells are erased, cleaned or repaired. The data are tracked by the logic controller. Once restored, the gates in the gate array mechanism return to the original passive position and the new data may be returned or new data may be stored in these cells.

Reprogrammable Complex Programmable Memory Devices

Unlike programmable SAMCs which allow the activation of pre-set gates at specific junctions, the reprogrammable CPMDs (R-CPMDs) allow flexible access to memory cells. In this embodiment of the invention, sensors are located at key positions of the memory arrays to assess data storage and data flow activities. When the sensors identify a threshold function, they send a signal to the controller, which activates the gates to open or close on demand. The sensor network in the memory cell array and the gate apparatus are coordinated by the logic controller. Once the gates are activated, the specific memory cells are closed as requested in a specific configuration.

The opening and closing of the memory cell arrays at specific junctions are useful to modulate the select memory storage and retrieval aspects. This modulation is useful to suit each mission.

The R-CPMD architecture is structured to partition memory components in a custom format for each memory chip type. Parts of the R-CPMD are used for (a) data storage only, (b) limited storage and retrieval of data, (c) memory storage reserves and (d) storage and restricted retrieval.

Once the specific configuration is selected by the R-CPMD, the circuit oscillates its structure for different applications. This allows the combination of the R-CPMD with specific logic devices in order to optimize a specific set of applications.

The analogy of this complex memory device is to the continuously reprogrammable FPGA in which the FPGA moves from one ASIC position to another ASIC position and to yet further ASIC positions as the custom logic controller requires. In the case of the reconfigurable FPGA, the multiple ASIC positioning allows the circuit to solve multiple complex optimization problems in a sequence. This is efficient because it limits in one chip the functions of multiple simpler chips but also because as unique solutions to complex evolutionary problems are discovered, the reprogrammable FPGA configures to customized structures.

In the case of the R-CPMD, the gate positioning of the gate array effectively oscillates between different structures for different applications. When memory efficiency is at a premium, the R-CPMD circuit structures to limit access to specific memory cell arrays. On the other hand, when memory flexibility is required, the R-CPMD structures to another configuration to optimize these applications. In this respect, the R-CPMD is re-usable for different applications, both simultaneously and sequentially, depending on its reconfiguration. In one embodiment of the R-CPMD, a list of memory cells is made at different times to assess the priorities of memory cells so as to maximize efficiency. For instance, cells on the periphery of the device or those prone to repeated error or repair are given a low priority.

When R-CPMDs are coupled to FPGAs, or to SoCs with at least one FPGA component, the repositioning of the gate arrays of both devices are coordinated to maximize efficiency in solving optimization problems associated with different applications. The FPGA changes its structure to a new ASIC position and sends a signal to the R-CPMD to modify the selective access to specific memory cells. The repositioning of the gates of the R-CPMD periodically in order to coordinate with the reprogrammable FPGA allows the logic device to maximize efficiencies. In one embodiment, the FPGA and the CPMD are positioned as adjacent layers in a multi-layer circuit.

CAD or electronic data automation (EDA) techniques are used to organize CPMD re-programmability. The placement of the gate array structures and the routing of data sets to specific memory cells are identified by CAD systems. The utility of the CAD techniques are to continuously reprogram the most efficient gate array configuration for specific memory cell storage and access for specific applications. Because of the complexity of organizing many gates in a CPMD, the use of CAD approaches accelerates the reconfiguration process. In particular, the CAD system changes the specified configuration of activated gate arrays to modify storage and access to multiple memory cell compartments simultaneously.

Because the R-CPMD is complex and involves reconfiguration of both memory and gate components that are controlled by the logic device, the programming for the logic device is organized by intellectual property (IP) cores that are customized to specific applications. While the simplest R-CPMD emulates an FPGA that repositions from one ASIC position to another ASIC position, more complex configurations of the R-CPMD are indeterministic. IP cores are useful to program the logic controller to activate the gate array mechanism to modify the accessible memory cell array architecture for multiple applications.

While the SAMC is generally deterministic, the R-CPMD is reconfigurable and may be indeterministic. The use of IP cores is well-suited to indeterministic applications of the R-CPMD model. IP cores use complex algorithms to solve multi-objective optimization problems. When an application requires multiple specific attributes, then an IP core will be selected to perform the multiple functions with the R-CPMD by reconfiguring the gate array architecture for each specific application. In some cases, a complex IP core will use multiple algorithms to control a complex sequence of R-CPMD configurations. Each algorithm and each IP core may be sold separately by third-party vendors.

One effect of changing memory array configurations periodically is that data flows change. These shifting data flows are tracked and optimized for different applications.

Three-Dimensional Circuit SAMC or CPMD Component

In one implementation, a CPMD (and SAMC) is integrated into a layer of a 3D integrated circuit. A CPMD is used in conjunction with logic devices. These logic devices may be ASICs, FPGAs, microprocessors, SoCs or hybrids of these device types. When situated on a layer of a 3D SoC, a CPMD may be adjacent to a logic device. However, when connected by TSVs, the CPMD may be on one non-adjacent layer while the logic device(s) may be on another layer.

CPMDs in a 3D circuit configuration provide a useful application of the present invention that increases efficiency and flexibility, particularly when used in conjunction with a complex logic device.

CPMDs consisting of SRAM memory cells may be used as supplemental memory for a FPGA layer.

In one implementation of the 3D CPMD, the gate array is located on one layer while the memory lattice array is located on another layer. In this case, the overlay of tracks is used to control the gate array mechanism.

Because CPMDs are coupled with logic devices, the multi-layer configuration is effective. The logic device is connected to the logic controller of the CPMD to control its main functions. As the logic device performs a program, including a reconfiguration of its structure, it activates the memory device logic controller to change its reconfiguration to optimize the performance of the two devices. A single reconfigurable FPGA may use two or more R-CPMDs to optimize two or more simultaneous applications.

SAMCs and CPMDs are well suited to 3D SoCs which are generally complex hybrid circuits. Because the R-CPMDs are reconfigurable, they continually optimize the SoC performance attributes.

Active Storage Memory CPMD

Active storage memory devices are memory circuits that contain internal logic control devices. In effect, the active storage memory device is a large storage facility with a small logic controller. Rather than use the von Neumann microprocessor architecture in which program code is fetched from memory by logic circuit components, the active memory performs memory-specific tasks with an internal logic controller.

The CPMD model is applicable to the active memory architecture. In this case, the SAMC, the CPMD and the R-CPMD are independent devices that contain logic controllers. The logic controllers in the CPMDs contain program code to store and access data in memory cell arrays. The logic controllers use complex programming, including IP cores, which contain algorithms to perform specific functions to activate gate arrays to close off specific memory cells at specific junctions at specific times in order to optimize specific applications and solve optimization problems.

Logic controllers in active storage memory CPMDs may be an ASIC (in a SAMC), a microprocessor, an FPGA or a SoC.

Active storage memory CPMDs are also implemented in 3D configuration. For example, in a 3D SoC, one layer may be an active storage memory CPMD, another layer an FPGA, another layer a SAMC and another layer a microprocessor. The logic layer(s) access the memory layers to optimize their performance.

Active storage memory CPMDs are complex memory modules that may be coupled in parallel in order to scale the memory functions of a complex computer system. The active storage memories are coupled with logic devices in order to constitute a new type of SoC optimized for memory intensive applications.

Modular CPMDs

CPMDs are memory modules that may be networked. The CPMDs are configured to scale many memory devices in a complex network that combines many logic devices. In the context of a modular network, the CPMD modules are added in the system as other modules are removed. Particularly in the context of modular SoCs, the CPMD is ideally used to add modules to a complex computer system.

In order to facilitate the modular CPMD network functionality, the CPMD uses a scalable bus. A logic circuit is used to track the memory device configuration and integrate the specific configuration of the CPMD into the SoC. The logic controller controls and modifies the scalable memory bus.

In one implementation, the bus architecture of the modular CPMD is adaptable. The reconfigurability of the CPMD bus allows the memory device to be reprogrammed to a specific configuration for each of different specific applications. As the SoC memory module network is reconfigured, the CPMD bus is reconfigured.

One advantage of the modular CPMD reconfigurable bus architecture is the flexibility to activate the bus of the memory device structure remotely. This remote activation of the bus structure allows the reconfiguration of the CPMD architecture to suit the requirements of a set of logic and memory components in a network. In effect, an equilibrium state is used as a solution to an optimization problem consisting of discovering the unique combined configuration of a set of reconfigurable logic and memory devices.

Another advantage of this modular structure is the ability of new databases to be configured in a computer network at different locations over time. Since data sets are moved from one memory device to another in the network, the ability to use the flexible architecture of the modular CPMD maximizes network efficiency. By using the system, data storage capacity moves from terabytes to exabytes by combining modules of CPMDs.

As new logic devices and SoCs are added to computer networks, using SAMCs, CPMDs and R-CPMDs provide increasing flexibility to systems to prevent obsolescence at minimum cost.

There are two main embodiments of the present invention. First the SAMC provides a main model for programmable memory. Second, the R-CPMD provides a reprogrammable attribute to memory components.

First Embodiment of the Invention

The SAMC uses predetermined gate arrays integrated into the memory cell arrays at specific junctions in order to constrain data storage and access to specific memory cells. After initially performing a diagnostic procedure activated by the logic controller in the SAMC, the controller identifies the specific problems of specific memory cells. Unlike prior BIST procedures, however, the present system uses the diagnostic information to actively organize the gate array structure to change the position of specific gates at specific junctions in order to constrain data storage and access to specific cells sites.

Specific cells sites are cordoned off while the remainder of the memory array cells is fully functional.

In one configuration of the present system, the SAMC gate structure closes off data in memory cells after data are stored. The system allows the data to be accessed, but not further stored or moved. In another configuration of the present system, the data in affected memory cells are moved to other regions for storage and all access to affected cells are closed by using the gate array apparatus; this is performed by activating specific gates at specific junctions. In either configuration, the system continues to use open memory cells in non-affected regions.

In a course grained model of the SAMC, whole sections of memory arrays are affected. In a fine grained model of the SAMC, however, specific memory cells are individually segregated by using small gates that constrain data storage and access.

The SAMC is programmed in different ways to correspond to the particular memory cell problems that are unique to each circuit and for use in specific applications.

The SAMC comes from the factory with programmable features in the logic controller that are programmed by the user. The user then identifies specific applications for each SAMC and programs the controller to use different algorithms to modify specific memory components by activating the gate array mechanism.

There are different biases of the SAMC for specific applications. For instance, when used in a SoC application, the SAMC is useful as an embedded controller. In a separate application, the SAMC is used in a DSP.

Second Embodiment of the Invention

An R-CPMD emulates the behavior of a continuously reprogrammable FPGA. An R-CPMD changes its gate structure on-demand in order to modify its architecture to different application specific uses.

An R-CPMD is able to change from a course grained gate structure to a fine grained gate structure because its high density gate array mechanism consists of more gates located at more junctions. The gates are activated in unique configurations and, then, on demand, changed to a different configuration. This model of gate array configuration modification is activated in parallel. That is, when one part of the R-CPMD is reconfigured, other parts are fully operational. In another implementation, the configuration modification is activated sequentially. In this case, the restructuring process may close down the operation of clusters of components in the device until the whole device is operational in a new application mode.

An R-CPMD uses IP cores to configure the gate array reconfiguration. IP cores use algorithms to activate specific combinations of gate array components to perform a restructuration.

Evolutionary IP cores are used to continuously reconfigure an R-CPMD. This model is useful in indeterminate environments. The logic controller uses CAD (or EDA) layout approaches to analyze the optimal configuration of the R-CPMDs to develop novel IP cores to solve indeterministic optimization problems.

Since R-CPMDs are coupled to continuously reprogrammable FPGAs and SoCs, they are useful in indeterministic environments which have no clear solution. In these cases, the R-CPMDs coordinate with the FPGAs by receiving feedback (via sensors) from the uncertain environment. The feedback is analyzed by the FPGA, which periodically restructures its configuration to optimize solutions. When the FPGA restructures, it sends a signal to the R-CPMD to reconfigure. The logic components of the FPGA may be integrated with the logic controller of the R-CPMD. The close coordination of the reprogrammable logic and memory devices couples the IP cores and algorithms of both devices.

In one implementation of the R-CPMD, the R-CPMD coordinates with the continuously reprogrammable FPGA to solve multiple evolutionary multi-objective optimization problems simultaneously. The combination of the two complex logic and memory devices allow for evolutionary adaptation. The evolutionary adaptation that results from the co-evolutionary interaction of the coupled devices with an indeterministic environment yields plasticity in an intelligent system.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

LIST OF ACRONYMS

ASIC, application specific integrated circuit
BIST, built-in self test
CAD, computer aided design
CPLD, complex programmable logic device
CPMD, complex programmable memory device
DRAM, dynamic random access memory
FPGA, field programmable gate array
IP, intellectual property
RAM, random access memory
R-CPMD, reprogrammable complex programmable memory device
SAMC, selective access memory circuit
SoC, system on a chip
SRAM, static random access memory
TSV, through silicon via

DESCRIPTION OF THE DRAWINGS

FIG. 29 is a schematic diagram of a SAMC showing each cell section in a grid configuration with a number designation.

FIG. 30 is a schematic diagram of a table showing the transfer of data between cells in two phases.

DETAILED DESCRIPTION OF THE DRAWINGS

The selective access memory circuit consists of a series of memory cells configured in arrays. The arrays are connected by interconnects. The memory cells and the arrays have gates that selectively allow access to specific regions of the devices. The gates are programmable and reconfigurable so that when combined in different configurations, the SAMC reorganize data in the available and accessible memory cells and arrays.

Figure 1:
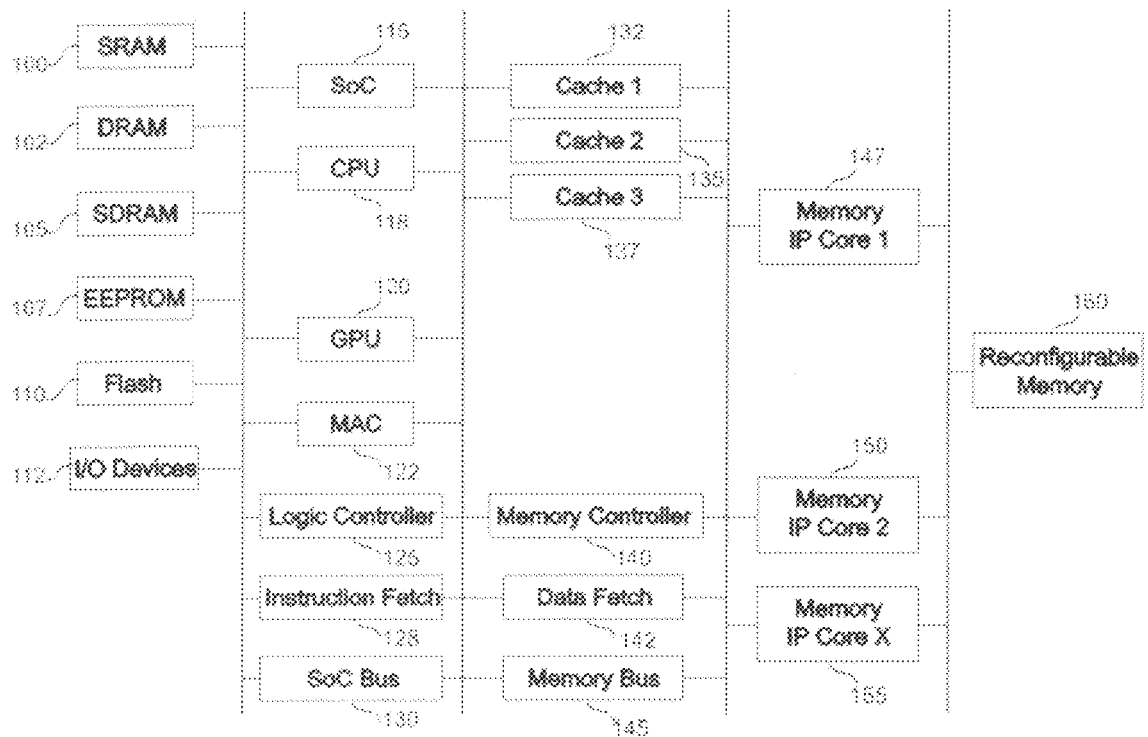
FIG. 1 is a block diagram of a configurable memory system.

FIG. 1 is a block diagram showing the structure of a configurable memory system. In column one, the external memory components are configured. These consist of SRAM (100), DRAM (102), SDRAM (105), EEPROM (107), Flash (110) and I/O devices (112) components. In the second column, the logic components are connected to the system, including an SoC (115), CPU (118), graphics processing unit (GPU) (120), multiply-accumulate-compute (MAC) (125), logic controller (125), instruction fetch (128) and SoC bus (130) components. In the third column, the layers of cache (1, 2 . . . x) (132, 135 and 137), memory controller (140), data fetch (142) and memory bus (145) components are configured. In the fourth column, the memory IP cores (1, 2 . . . x) (147, 150 and 155) are configured. The reconfigurable memory component is connected at 160.

Figure 2:
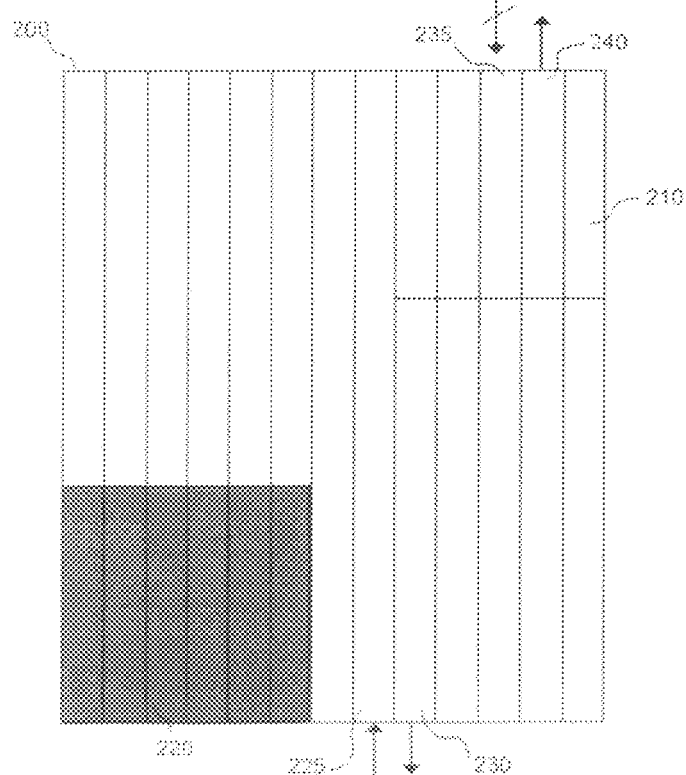
FIG. 2 is schematic diagram of a selective memory array.

FIG. 2 shows a selective memory array (200). In the lower left corner, the gray zone (220) demarcates a region of the memory device that is closed off from inputs and access of data. Data is input into the device at 225 and data is exported from the device at 230 and at 240. In the zone in the upper right of the device (210), data are exported (240), but not imported (235).

Figure 3:
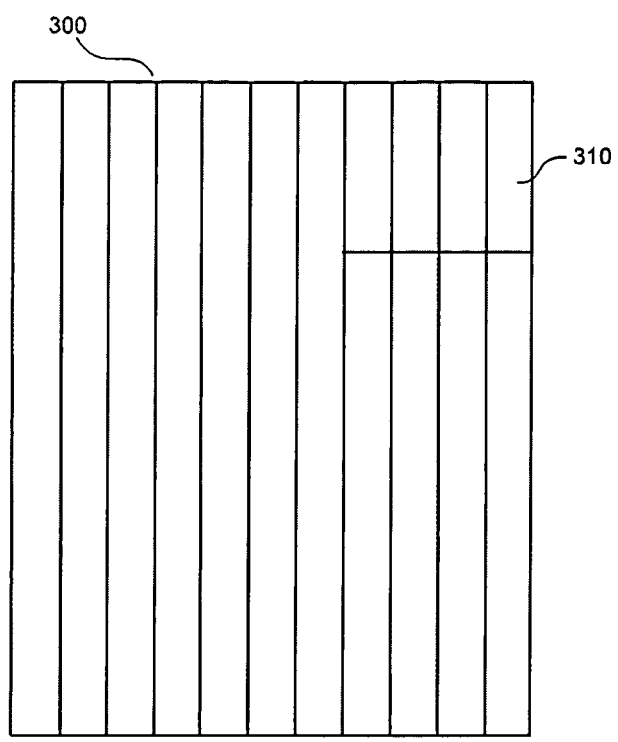
FIG. 3 is a schematic diagram of a selective memory system demarcating a specific area of memory cells.
Figure 4:
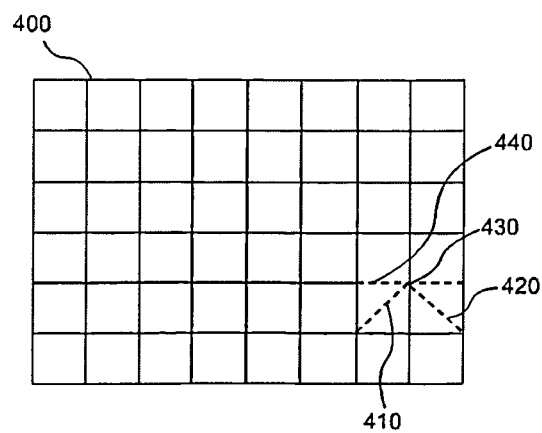
FIG. 4 is a schematic diagram of a memory array with a mechanical gate that closes on specific cells.
Figure 5:
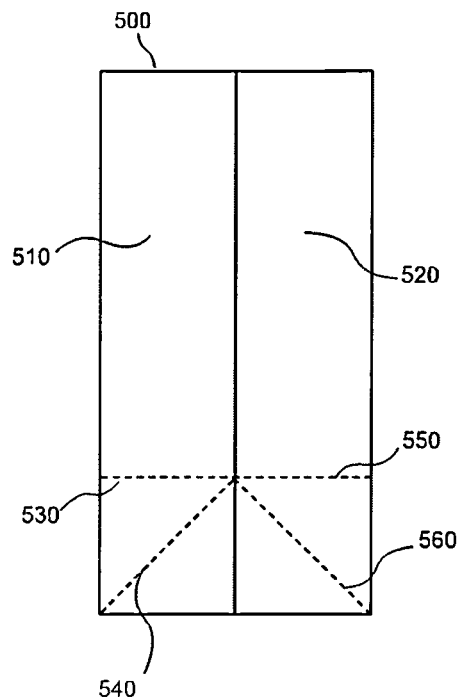
FIG. 5 is a schematic diagram showing a mechanical gate that closes on specific cells.

FIG. 3 shows a selective memory system (300) consisting of a set of memory arrays and a region in the upper right section (310) of the device that is demarcated from the other arrays. FIG. 4 is a diagram of a memory array (400) with a mechanical gate (430) that opens and closes in different positions (410, 420 and 430). FIG. 5 shows the mechanical gate that closes on specific cells (500, 510 and 520). The gate is shown in position at 530 and 540; when deployed in the position at 530, the gate terminates the entrance and exit of data from the left cell (510). Similarly, the gate is shown in position at 550 and 560 as it pivots to the right and terminates the entrance and exit of data from the right cell (520).

Figure 6:
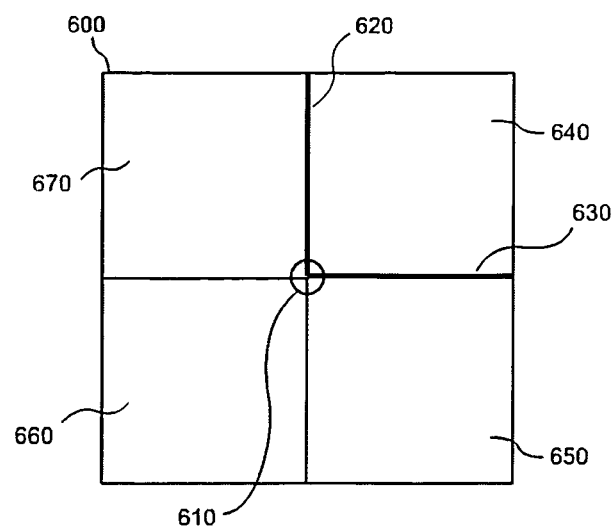
FIG. 6 is a schematic diagram showing an electronic gate that closes off a memory cell.

FIG. 6 shows an electronic gate that closes off a memory cell in a memory device (600). The junction of the gate (610) is used to activate the closure of the cell (640) at 620 and 630. The adjacent cells (650, 660 and 670) in the memory device remain accessible. This figure only shows a segment of a memory cell array.

Figure 7:
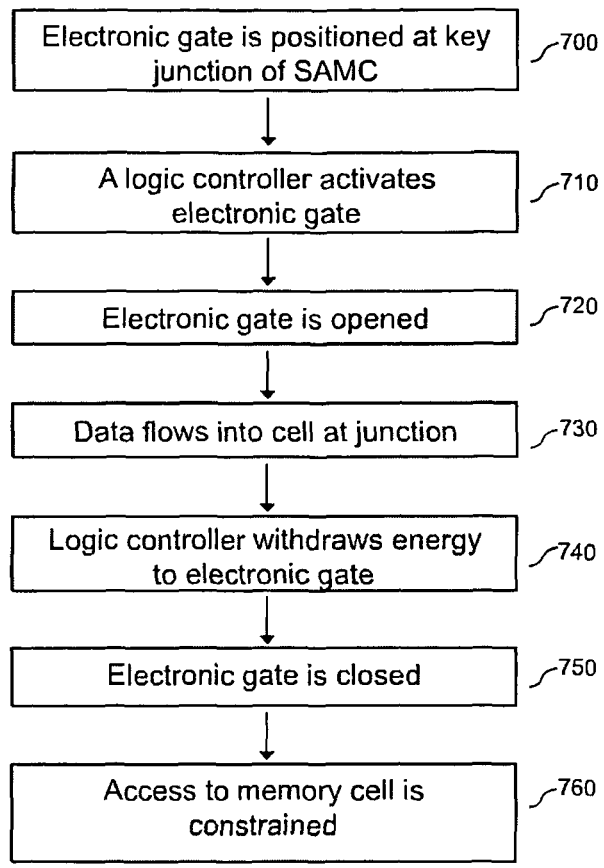
FIG. 7 is a flow chart showing the process of using electronic gates to control data flows in a memory cell.

FIG. 7 shows the process of using electronic gates to control data flow in a memory cell. After the electronic gate is positioned at a key junction of the SAMC (700), a logic controller activates an electronic gate (710). The electronic gate is then opened (720) and data flows into the cell at the junction (730). The logic controller withdraws energy to the electric gate (740) and the electronic gate is closed (750) and access to the memory cell is constrained (760). In some cases the logic controller will activate an actuator that activates the electronic gate.

Figure 8:
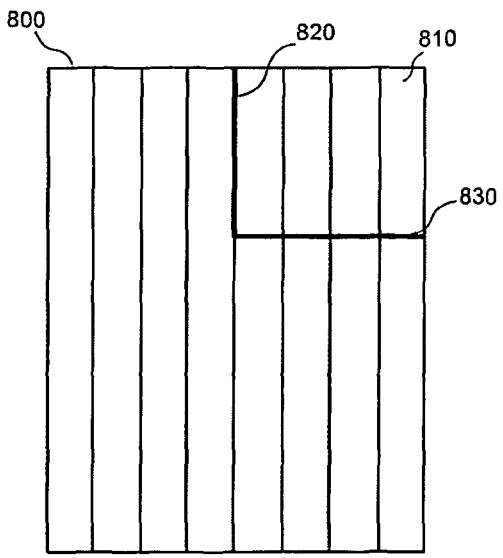
FIG. 8 is a schematic diagram showing a section of a memory device that is segmented on two sides.

FIG. 8 shows a section of a memory device (800) that is segmented on two sides (820 and 830). The region (810) of the device that is segregated may be limited in the access to data storage capability and data search accessibility when the region is in a closed position.

Figure 9:
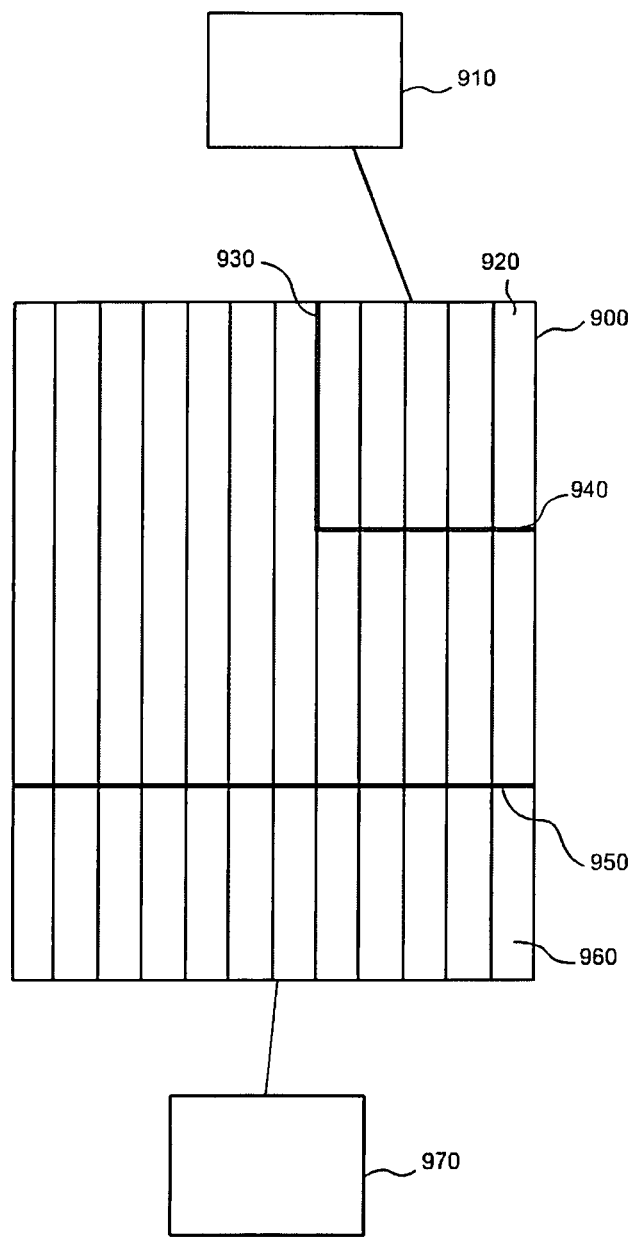
FIG. 9 is a schematic diagram showing two segmented memory sections of a memory device used for different applications.

FIG. 9 shows two segmented memory sections for different applications. The memory device (900), consisting of a series of memory cell arrays, has a region in the upper right (920) sectioned off at 930 and 940, and a region at the bottom (960) sectioned off at 950. The bottom region is accessible to the device at 970. The top right region is accessible to the device at 910. In this way, the main memory device is able to simultaneously interact with two or more devices.

Figure 10:
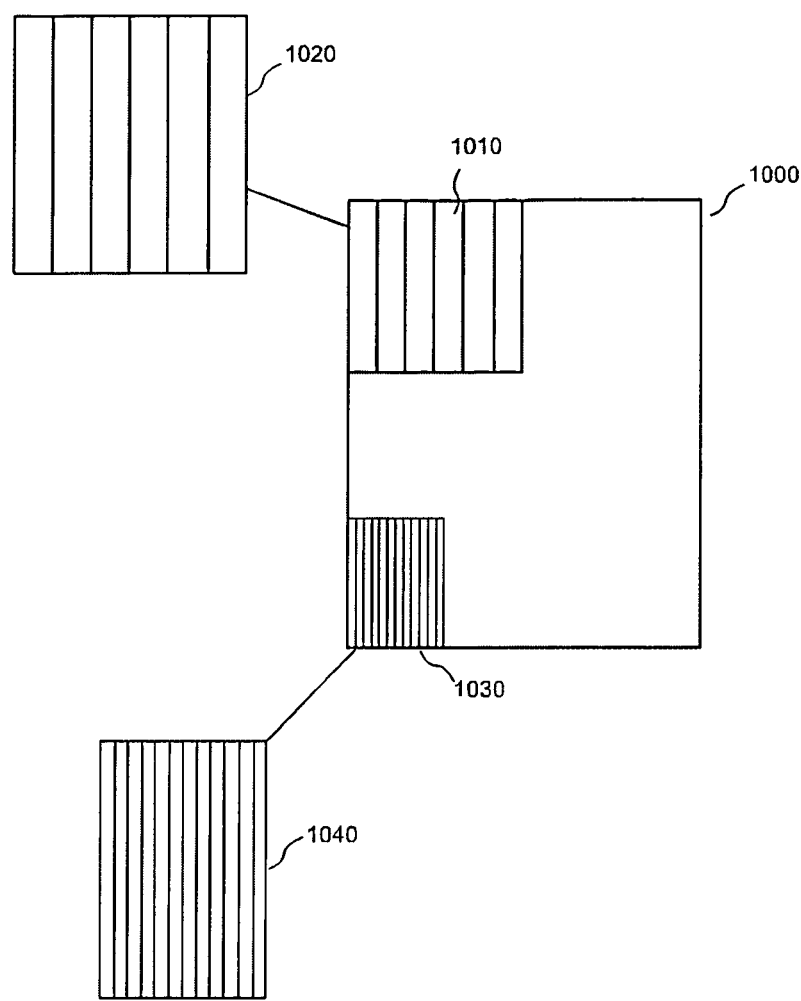
FIG. 10 is a schematic diagram showing fine grained and course grained memory partitions in a memory device.

FIG. 10 shows the fine grained and course grained memory partitions in a memory device. The main device (1000) contains a course grained memory region (1010) and a fine grained memory region (1030) that consist of sets of memory cell arrays. The drawing shows a cut out of the course grained region (1020) and a cut out of the fine grained region (1040).

Figure 11:
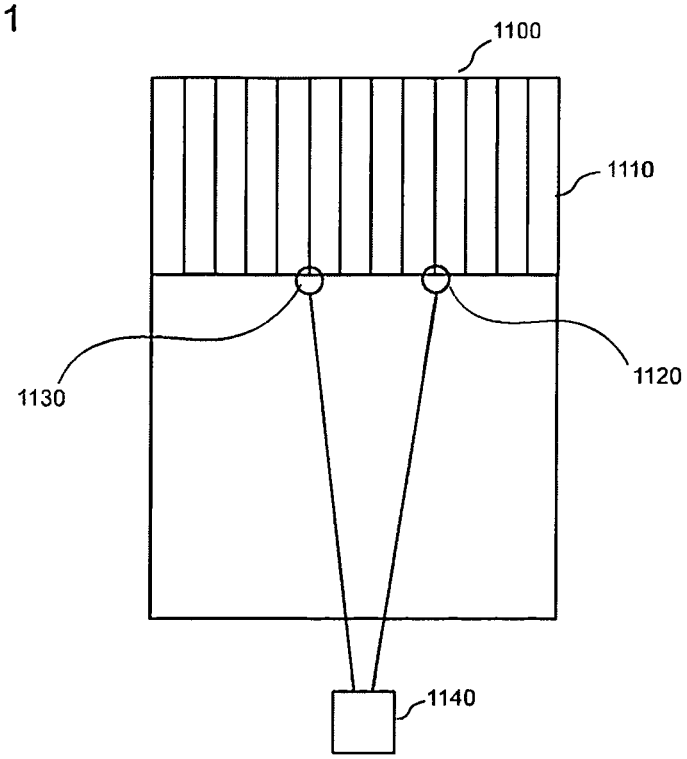
FIG. 11 is a schematic diagram showing a logic controller controlling and synchronizing two gates in a memory device.

FIG. 11 shows a logic controller controlling and synchronizing two gates in a memory device (1100). The device consists of a set of memory cell arrays (1110), with the gates (1120 and 1130) located at junctions in the memory device. The gates are controlled by the logic controller (1140). The logic controller may be internal to the memory device or external to the device. The gates are shown configuring the memory device to segregate the top section from data access and/or storage.

Figure 12:
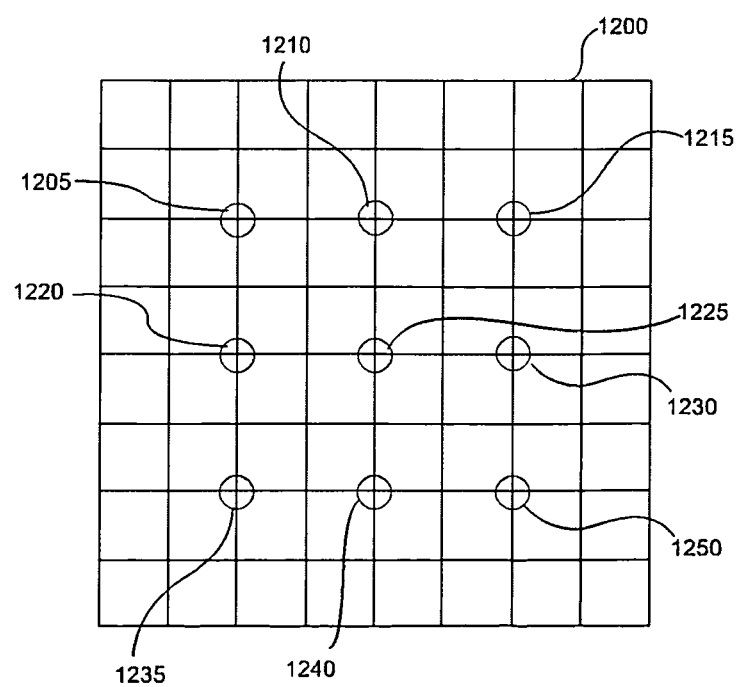
FIG. 12 is a schematic diagram showing multiple gates at specific course grained positions in a memory device.
Figure 13:
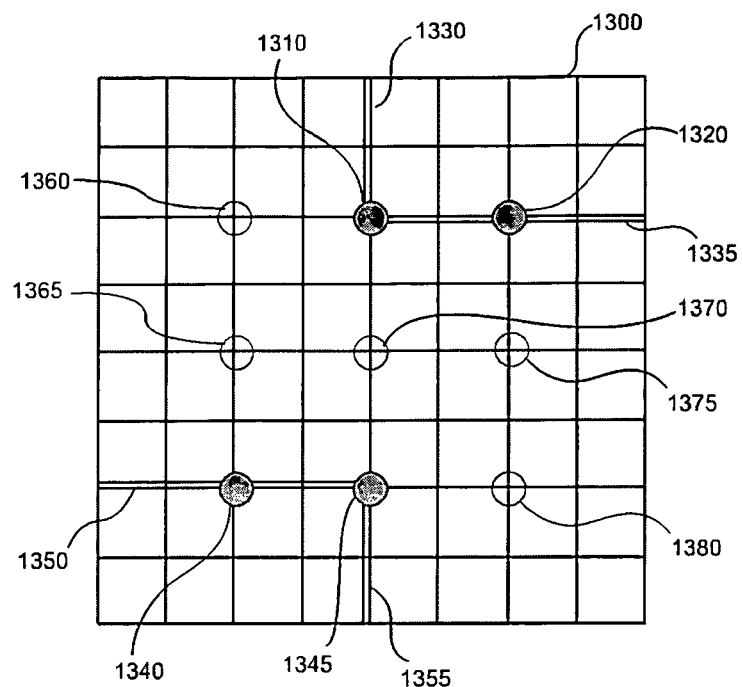
FIG. 13 is a schematic diagram showing specific gates activated to close off specific regions in a memory device.

FIG. 12 shows multiple gates at specific course grained positions in a memory device (1200). The gates are shown at junctions (1205, 1210, 1215, 1220, 1225, 1230, 1235, 1240 and 1250) of the memory array grid. These gates may be activated in different combinations in order to segregate different sections of the memory device. FIG. 13 shows the gates of a selective access memory circuit activated in specific configurations. The memory device (1300) is shown with gates at junctions (1360, 1310, 1320, 1365, 1370, 1375, 1340, 1345 and 1380). Specifically, the gates at 1340 and 1345 are activated, which actively cordon off sections 1350 and 1355 at the bottom left region of the device. Also, the gates at 1310 and 1320 are activated, which actively cordon off sections 1330 and 1335 at the top right region of the device.

Figure 14:
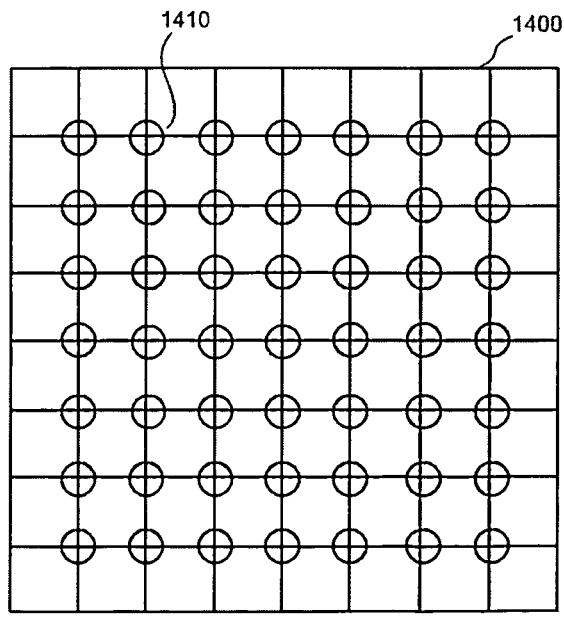
FIG. 14 is a schematic diagram showing gates at specific fine grained positions in a memory device.
Figure 15:
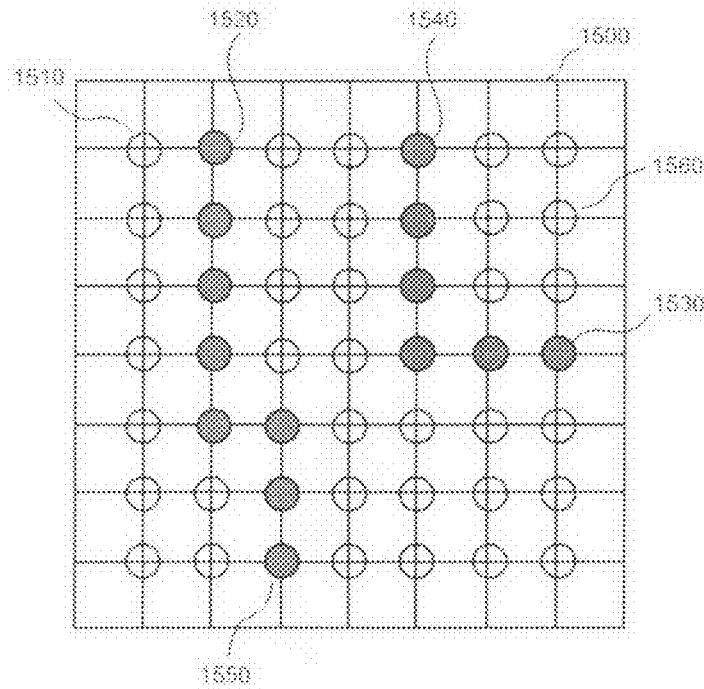
FIG. 15 is a schematic diagram showing specific fine grained gates in a closed position in a memory device.

FIG. 14 shows gates (1410) at specific fine grained positions in a memory device (1400). The gates are positioned at regular intervals at junctions in the memory array. FIG. 15 shows specific fine grained gates in a closed position in a memory device (1500). The un-darkened gates are depicted (1510 and 1560). The sequences of adjacent gates that are active are shown at 1520, 1530, 1540 and 1550. These sequences of gates are combined to close off specific regions of cells in the selective access memory device.

Figure 16:
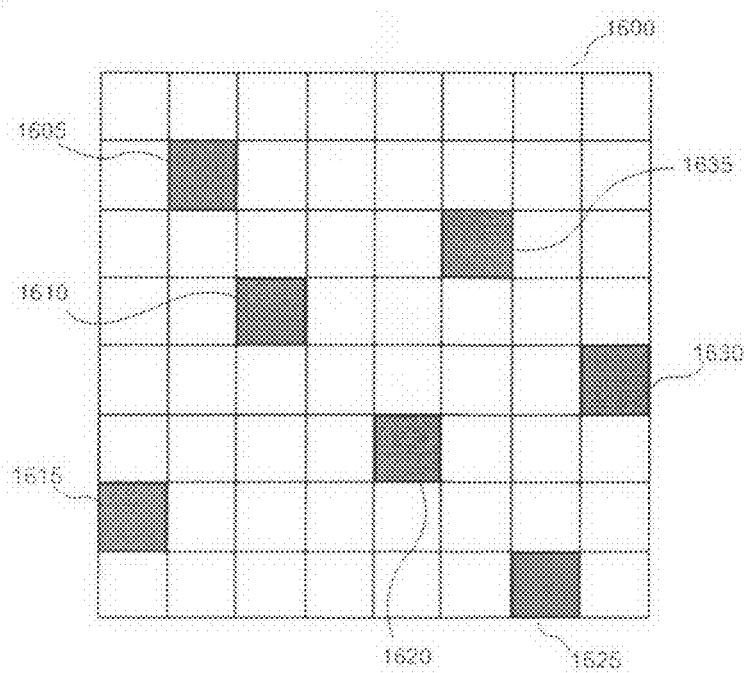
FIG. 16 is a schematic diagram showing specific cells closed in a memory device.

FIG. 16 shows specific cells closed in a memory device (1600). The specific cells that are closed are marked at 1605, 1610, 1615, 1620, 1625, 1630 and 1635. The specific cells are closed on demand but may be reopened as well. When the cells are closed, data may remain inside, data may be removed permanently, data may be temporarily inaccessible or data may be accessed, depending on the programming of the memory device. Further, different cells may be programmed independently of the other cells, thereby allowing a combination of data storage and accessibility.

Figure 17:
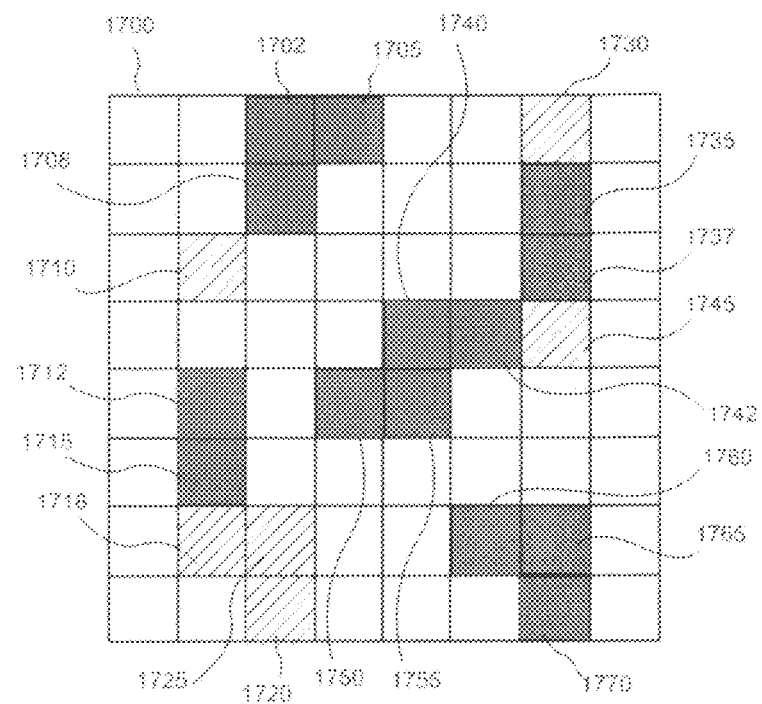
FIG. 17 is a schematic diagram showing contiguous cells closed in a memory device.

FIG. 17 shows contiguous cells closed in a memory device (1700). In this example, the cells at 1710, 1730, 1718, 1720, 1725, 1730 and 1745 are partially closed to new data storage, but may be accessed. The cells at 1702, 1705, 1708, 1712, 1715, 1735, 1737, 1740, 1742, 1750, 1755, 1760, 1765 and 1770 are closed to new data storage and are not accessible.

Figure 18:
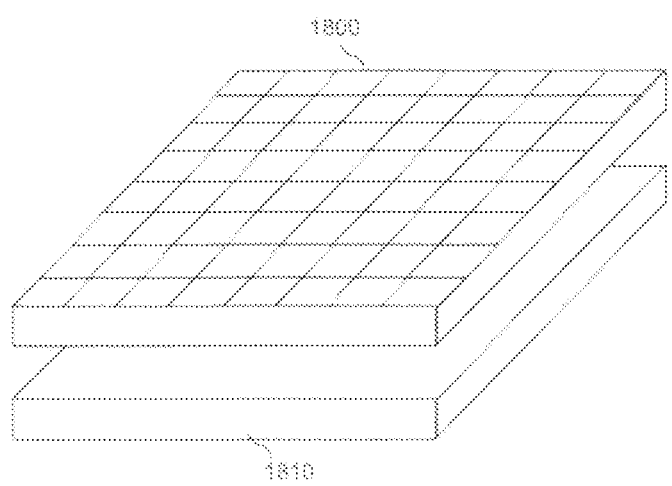
FIG. 18 is a schematic diagram showing a second layer of gates over a memory chip layer of a memory device.
Figure 19:
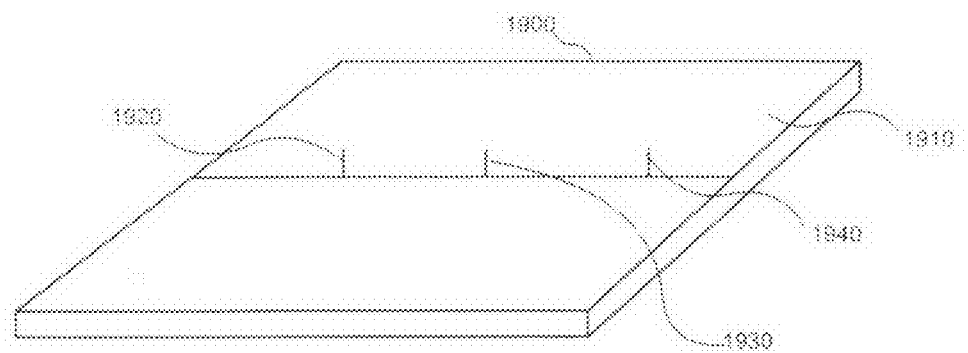
FIG. 19 is a schematic diagram showing the through silicon vias from a lower layer that are extended to reveal closed sections of a memory layer in a multi-layer chip.

FIG. 18 is a schematic diagram showing a second layer of gates (1800) over a memory chip layer of a memory device (1810). FIG. 19 shows three "through silicon vias" (tsv's) (1920, 1930 and 1940) from a lower layer (1910) of a memory device (1900) that are extended to reveal closed sections of a memory layer in a multi-layer chip.

Figure 20:
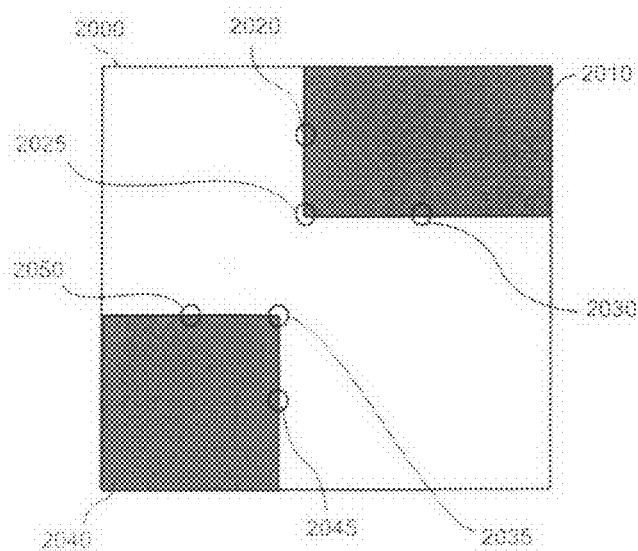
FIG. 20 is a schematic diagram showing a memory chip with gates closed in a specific position that limits access to two areas of the chip while allowing access to other areas.

FIG. 20 shows a memory chip (2000) with gates (2035, 2045 and 2050 in the lower left and 2020, 2025 and 2030 in the upper right) closed in a specific position that limits access to two areas of the chip (2010 and 2040) while allowing access to other areas.

Figure 21:
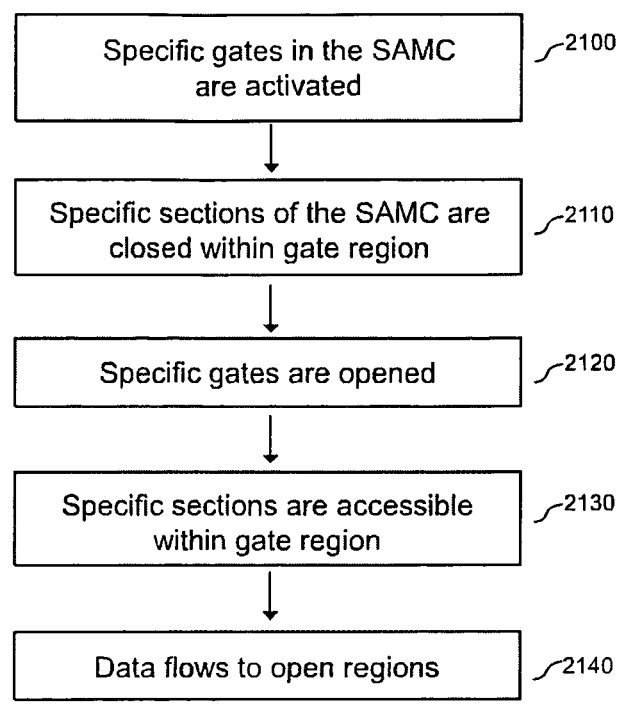
FIG. 21 is a flow chart describing the process of using gates to open and close a specific section of a selective access memory circuit.

FIG. 21 shows the process of using gates to open and close a specific section of a selective access memory circuit. After specific gates in the SAMC are activated (2100), specific sections of the SAMC are closed within the gate region (2110). The specific gates are then opened (2120) and specific sections are accessible within the gate region (2130) and data flows to the open regions (2140).

Figure 22:
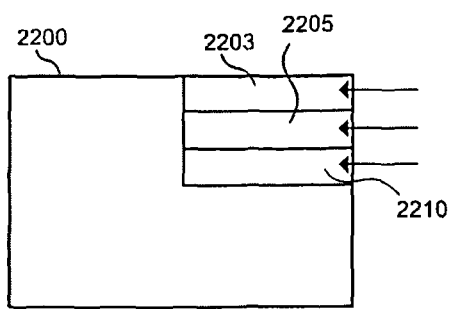
FIG. 22 is a schematic diagram showing the several phases of data entering a selective access memory circuit in which gates are activated to close a section to limit access.
Figure 22:
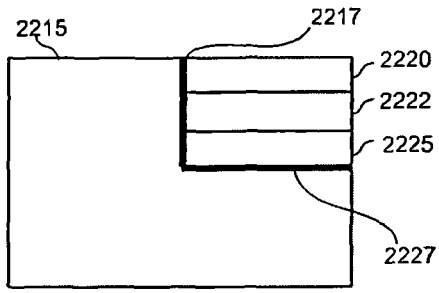
Figure 22:
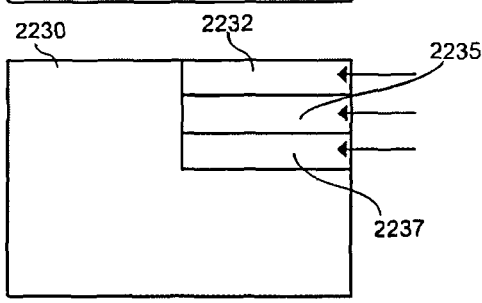
Figure 22:
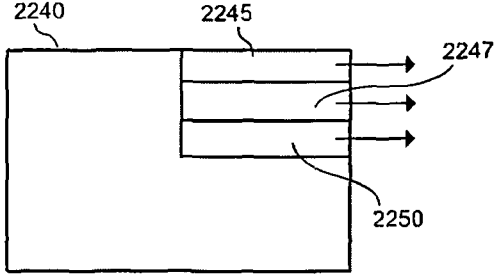

FIG. 22 shows the several phases of data entering an SAMC in which gates are activated to close a section to limit access. In phase I, the gates allow the memory arrays at 2203, 2205 and 2210 in the SAMC (2200) to allow data in. In phase II, the gates are closed in rows at 2217 and 2227 that allow data to remain stored in the memory arrays at 2220, 2222 and 2227 of the SAMC (2215). In phase III, the data are allowed into the memory arrays at 2232, 2235 and 2237 of the SAMC (2230). Finally, in phase IV, the data are accessible to be retrieved from the memory arrays at 2245, 2247 and 2250 of the SAMC (2240).

Figure 23:
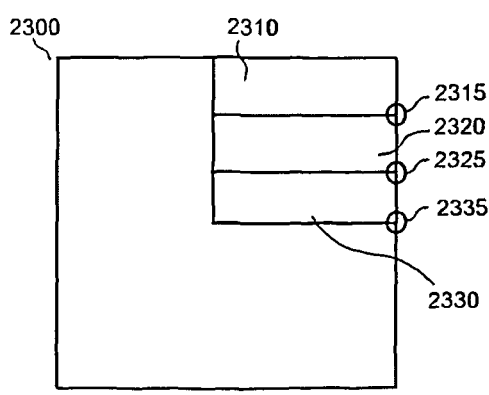
FIG. 23 is a schematic diagram showing the position of sensors on a selective access memory circuit.

FIG. 23 shows the position of sensors on a SAMC (2300). The sensors are shown located at positions of the external junctions of memory arrays at 2315, 2525 and 2335. The array sections are shown at 2310, 2320 and 2330.

Figure 24:
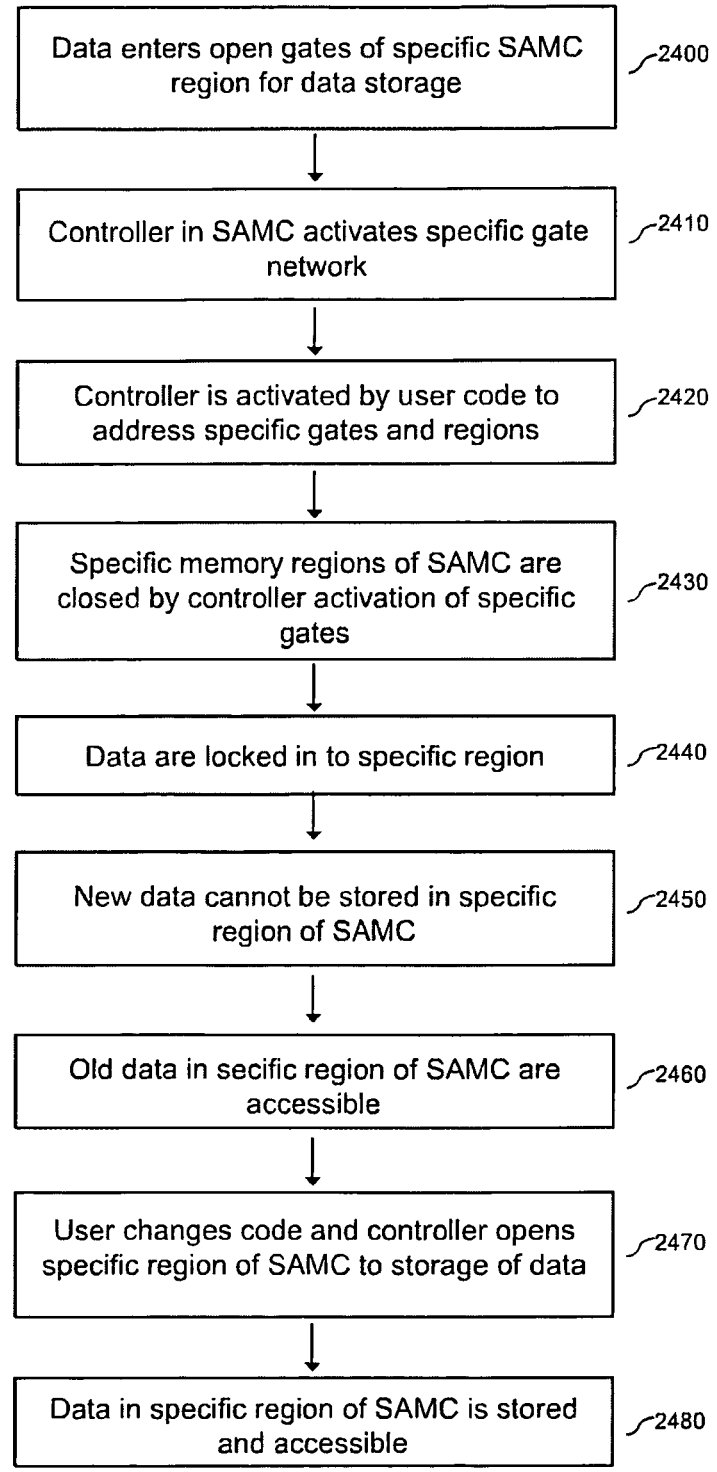
FIG. 24 is a flow chart showing use of a controller to lock specific sections of a selective access memory circuit.

FIG. 24 shows the process of using a controller to lock a specific section of a SAMC. After data enter open gates of a specific SAMC region for data storage (2400), the controller in the SAMC activates a specific gate network (2410). The controller is activated by user code to address specific gates and regions (2420) and the specific memory regions of the SAMC are closed by the controller activation of specific gates (2430). The data are then locked in to a specific region (2440) and new data cannot be stored in a specific region of the SAMC (2450). The old data in a specific region of the SAMC are accessible (2460), the user changes the code, the controller opens a specific region of the SAMC to storage of data (2470) and data in a specific region of the SAMC are stored and accessible (2480).

Figure 25:
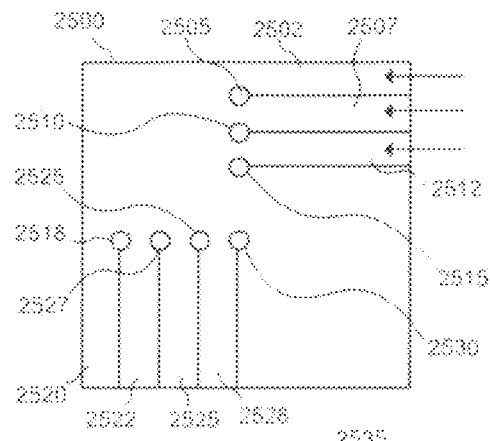
FIG. 25 is a schematic diagram showing the phases in the process of shifting data from one section of a SAMC to another section.
Figure 25:
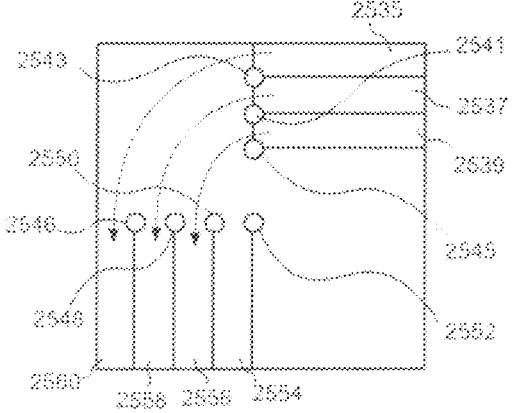
Figure 25:
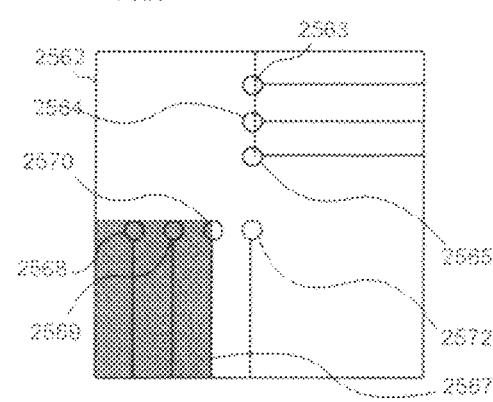
Figure 25:
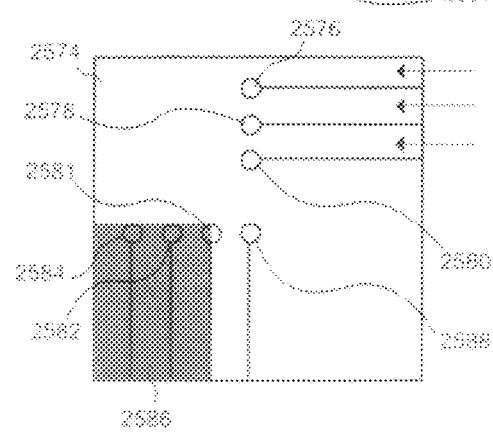

FIG. 25 shows the phases in the process of shifting data from one section of a SAMC to another section. In phase I, the SAMC (2500) is shown with memory arrays in regions that are open. The arrays in the right top section accept incoming data at 2502, 2507 and 2512 from external sources. The gates in the region are positioned at 2505, 2510 and 2515. The region in the bottom left is open, with arrays demarcated at 2520, 2522, 2525 and 2528. The gates are shown at 2518, 2527 and 2530. In phase II, the SAMC (2533) is shown with data moving from the upper right region from memory arrays at 2535, 2537 and 2539. The data are moved to the memory arrays (2560, 2558, 2556 and 2554) in the lower left region at 2560, 2558 and 2556. The gates (2546, 2548, 2550 and 2552) in the lower left region are opened to allow access to the data. The gates (2541, 2543 and 2545) in the upper right region are open to allow the transfer of data and then the gates are closed. Data are not allowed into the upper right region. In phase III, the SAMC (2562) is configured to have closed upper right region gates (2563, 2564 and 2565) with no data in the region, no data entering and no data leaving. In the lower left region, the data are stored in the memory area (2567) with the gates (2568, 2569 and 2570) closed and the gate at 2572 opened. The three sections with the closed gates have data that are stored but not accessible. In phase IV, the SAMC (2574) is shown with the gates in the upper right region reopened (2576, 2578 and 2580) with data entering for storage. The data stored in the lower left section have gates closed at 2581, 2582 and 2584 comprising the section at 2586. The gate at 2588 is open and allows data storage and access. This model allows the memory unit to selectively store data in specific regions and to reprogram, and reconfigure, to change the storage and accessibility of different regions on demand.

Figure 26:
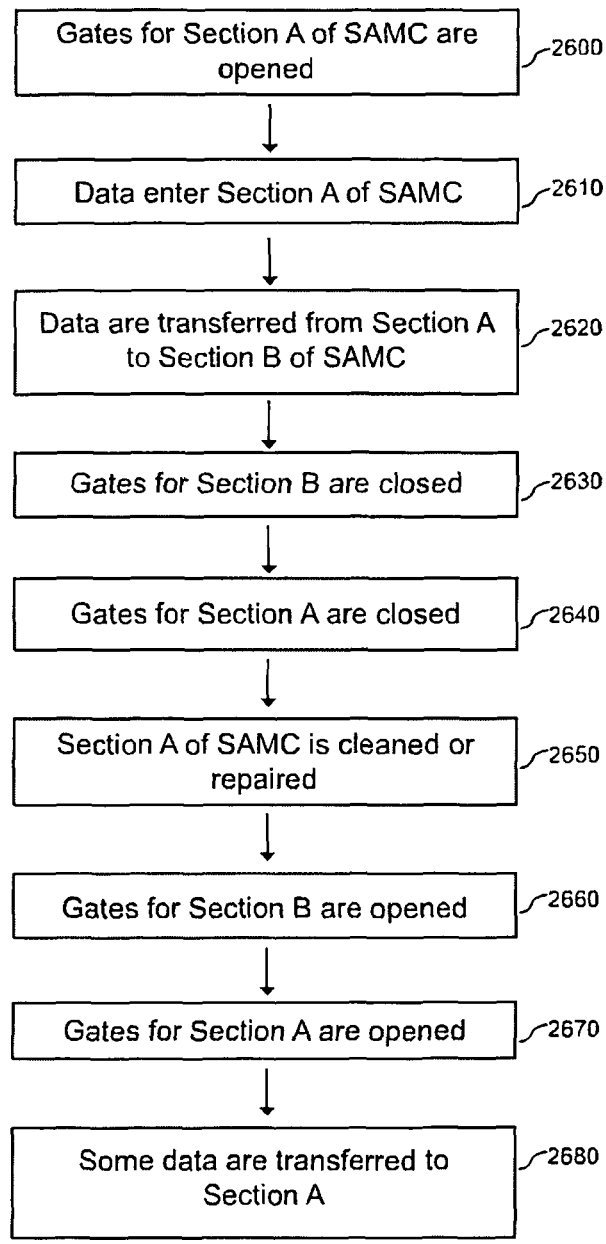
FIG. 26 is a flow chart showing the process of activating gates in two sections of the SAMC to transfer data between sections.

FIG. 26 shows the process of activating gates in two sections of the SAMC to transfer data between sections. After the gates for section A of the SAMC are opened (2600), data enter section A of the SAMC (2610) Data are transferred from Section A and section B of the SAMC (2620) and the gates for section B (2630) and section A (2640) are closed. Section A of the SAMC is cleaned or repaired (2650) and the gates for section B are opened (2660). Gates for section A are opened (2670) and some data are transferred to section A (2680).

Figure 27:
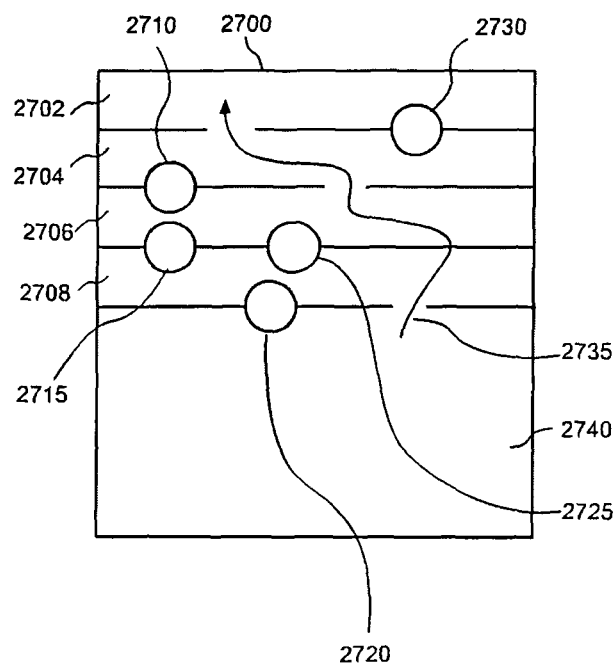
FIG. 27 is a schematic diagram showing how data is accessible in the SAMC cells around sections with closed gates.

FIG. 27 shows how data is accessible in the SAMC cells around sections with closed gates. The SAMC (2700) is highlighted with a top section of gates (2710, 2715, 2720, 2725 and 2730) and memory arrays (2702, 2704, 2706 and 2708) shown. The bottom section is shown at 2740. Despite gate closures at the different locations identified, the data are moved on a path (2735) through the closed memory array components. The data flow pathway is described as a combinatorial optimization solution of where the combination of adjoining gates are structured in a specific sequence, much as stop lights are coordinated to open to allow traffic to pass in specific patterns based on the timing of the lights.

Figure 28:
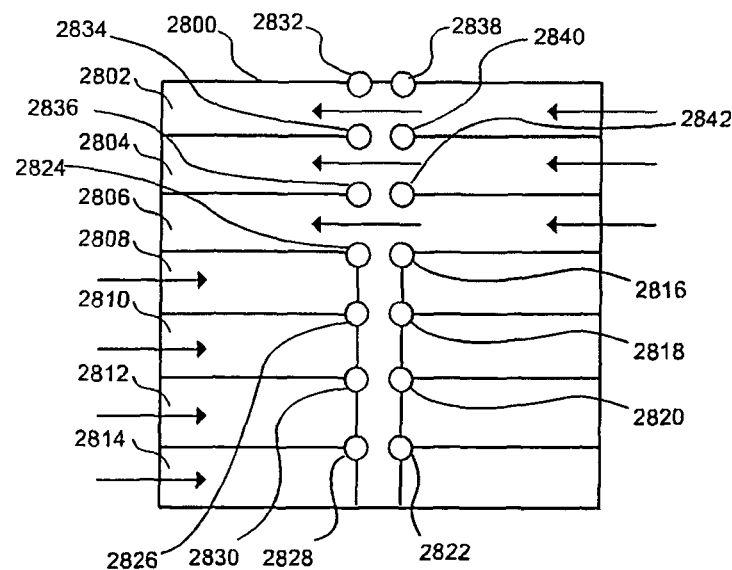
FIG. 28 is a schematic diagram showing simultaneous data entry, closure and repositioning of data in different sections of the SAMC.

FIG. 28 shows the simultaneous data entry, closure and repositioning of data in different sections of the SAMC. In the top third of the SAMC (2800), the gates (2832, 2838, 2834,

2840, 2836 and 2842) are open. Data flows into the memory arrays at 2802, 2804 and 2806 from external sources as illustrated. In the bottom right, the gates (2816, 2818, 2820 and 2822) are closed and data are not able to be stored or accessed in this section. In the bottom left, the gates (2824, 2826, 2828 and 2830) are closed but data flows into the memory arrays at 2808, 2810, 2812 and 2814.

FIG. 29 shows a SAMC (2900) displaying each cell section in a grid configuration with a number designation. The numbers (1-10) are listed on the left side column and the letters (A-J) are listed in the top column. Each box in the grid is designated with an alphanumeric identification.

FIG. 30 is a table (3000) showing the transfer of data between cells in two phases. In the first phase, data are transferred in five steps from one cell to another cell in the SAMC. First, data are transferred from A1 to D2. Second, data are transferred from E1 to G4. Third, data are transferred from B6 to H9. Fourth, data are transferred from I8 to C5. Fifth, data are transferred from J3 to F1. In phase II, data are transferred from one cell to another. First, data are transferred from D2 to I4. Second, data are transferred from G4 to A2. Third, data are transferred from H9 to G6. Fourth, data are transferred from C5 to E8. Fifth, data are transferred from F1 to F10. These examples are illustrative of possible sequences.

Figure 31:
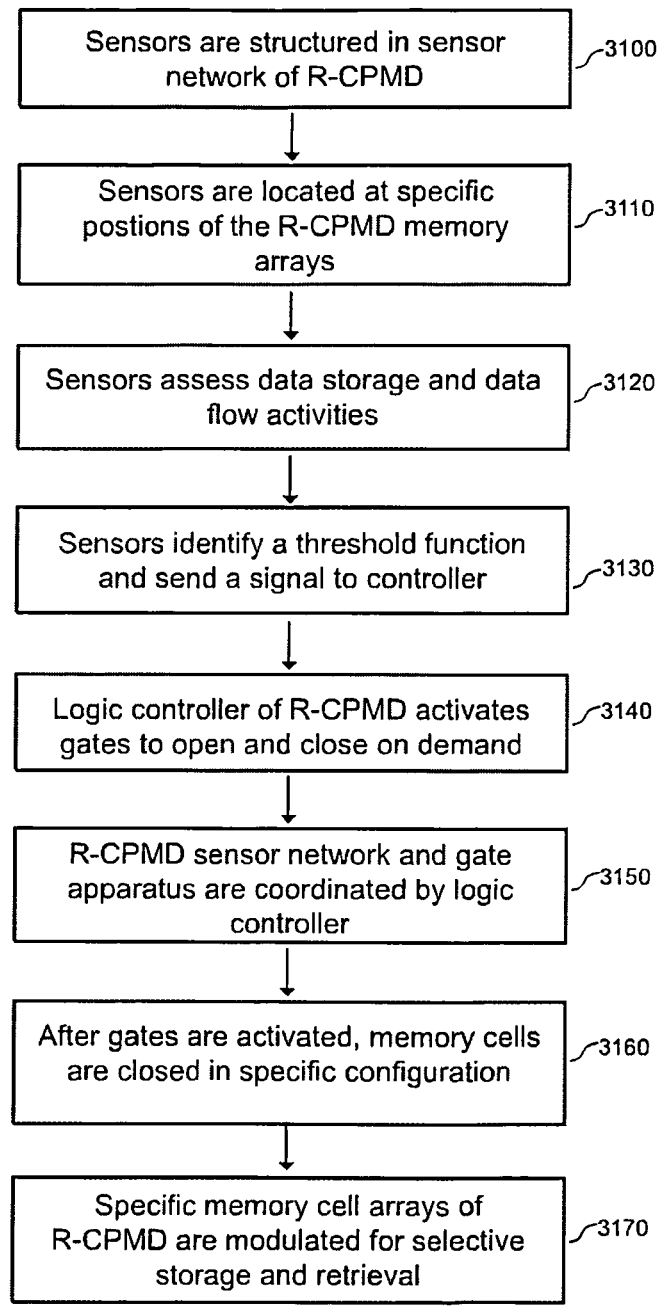
FIG. 31 is a schematic diagram showing the process of using sensors and a logic controller to manage the transfer of data in an R-CPMD.

FIG. 31 shows the process of using sensors and a logic controller to manage the transfer of data in an R-CPMD. Sensors are structured in the sensor network of a R-CPMD (3100), and are located at specific positions of the R-CPMD's memory arrays (3110). The sensors assess data storage and data flow activities (3120), identify a threshold function and send a signal to a controller (3130). The logic controller of the R-CPMDs activates the memory cell gates to open and close on demand (3140). The R-CPMD sensor network and gate apparatus are coordinated by a logic controller (3150). After gates are activated, memory cells are closed in a specific configuration (3160). The specific memory cell arrays of the R-CPMD are modulated for selective storage and retrieval (3170).

Figure 32:
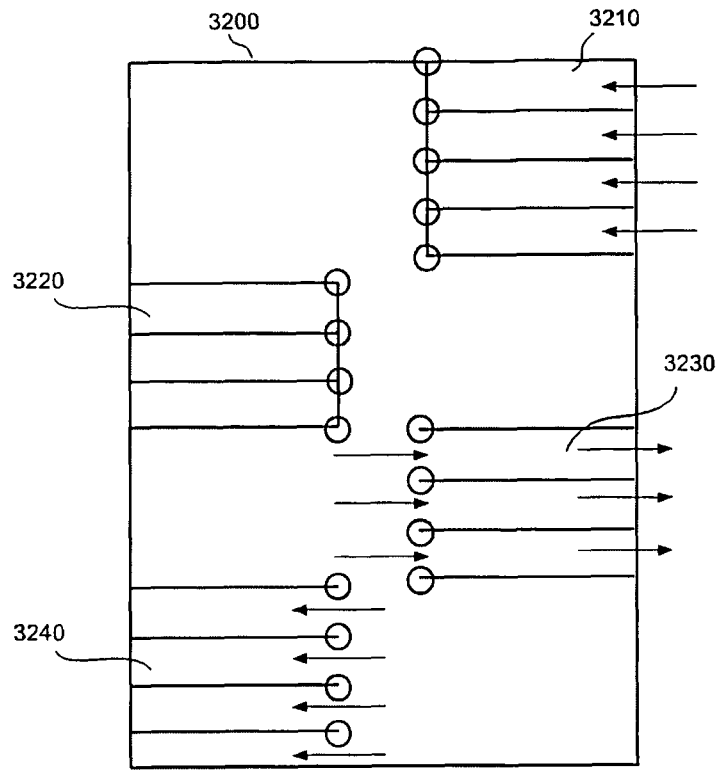
FIG. 32 is a schematic diagram showing the different parts of an R-CPMD used for data storage only, data access only, data storage and limited data retrieval.

FIG. 32 shows a schematic diagram displaying the different parts of an R-CPMD used for data storage only, data access only, data storage and limited data retrieval. The R-CPMD (3200) is shown with a top right region (3210) configured with closed gates that allow external data in. The left middle region (3220) is configured with closed gates that do not allow data in. The lower right region (3230) is open, thereby allowing data flows into the region, as well as accessibility of data from external sources. Finally, the lower left region (3240) is shown with gates open and data flows entering the memory arrays.

Figure 33:
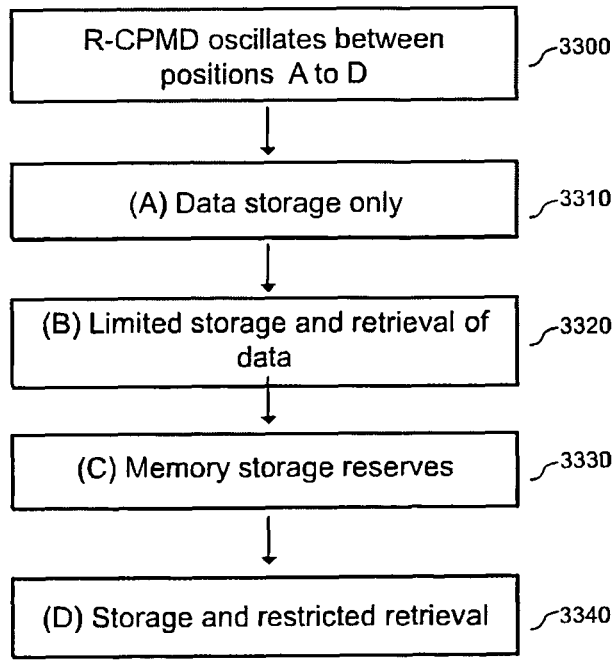
FIG. 33 is a flow chart showing the oscillation of an R-CPMD between four main positions.

FIG. 33 shows the oscillation of an R-CPMD between four main positions. The R-CPMD oscillates between positions A to D (3300). In position A, data are stored only (3310). In position B, there is limited data storage and retrieval (3320). In position C, the memory storage has reserves (3330). In position D, there is storage and restricted retrieval (3340).

Figure 34:
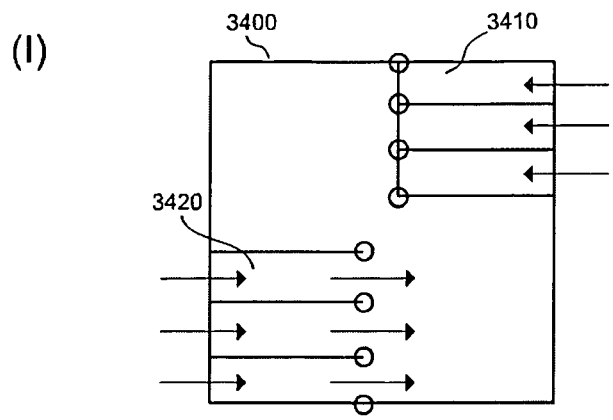
FIG. 34 is a schematic diagram showing the data flows in and out of different sections of a R-CPMD as the configuration changes.
Figure 34:
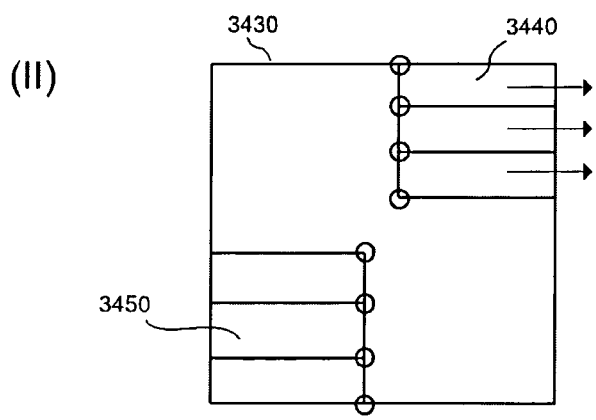
Figure 34:
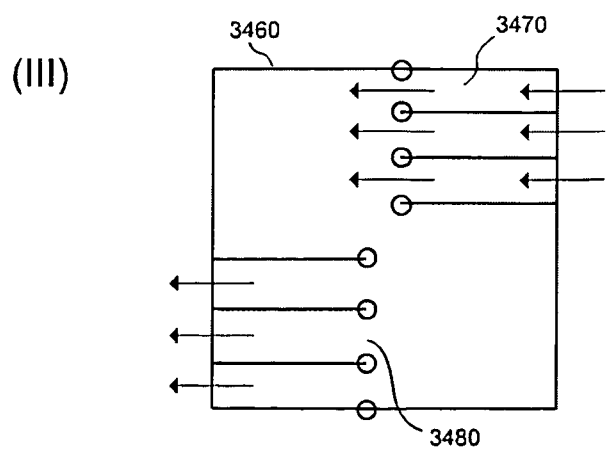

FIG. 34 shows data flows in and out of different sections of a R-CPMD as the configuration changes. In phase I, the R-CPMD (3400) is shown with data flowing into the closed region at 3410 and with data flowing into and out of the open region at 3420. In phase II, the R-CPMD (3430) is shown with data retrieved from the region at 3440 and the section closed off to data flows or access at 3450. In phase III, the R-CPMD (3460) is shown with the region at 3470 receiving external data flows with open gates and with accessibility to data access at the region at 3480.

Figure 35:
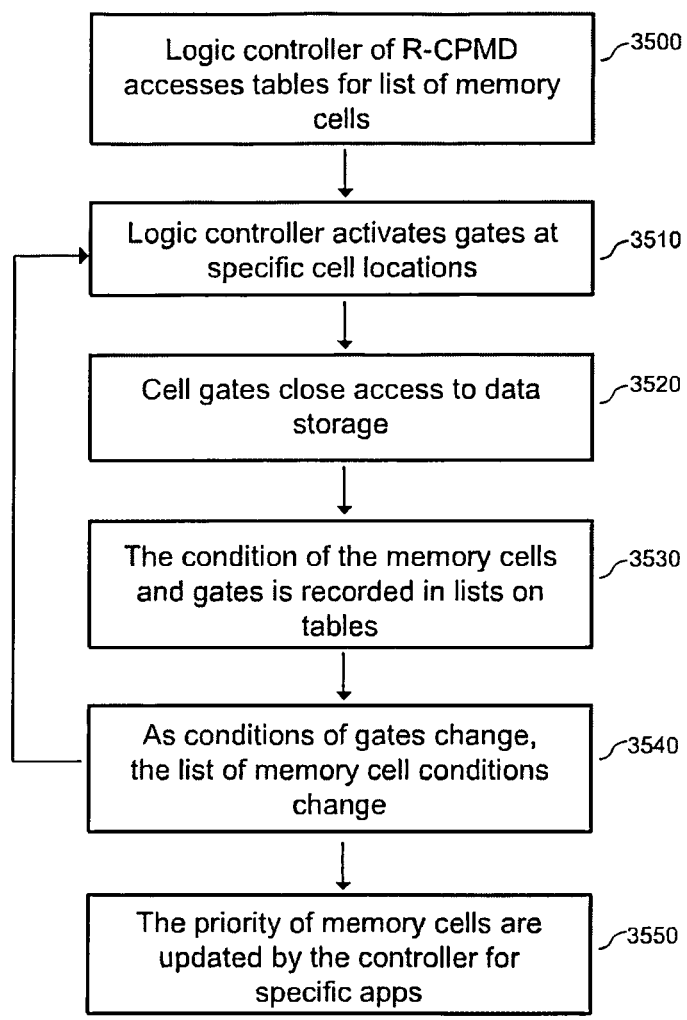
FIG. 35 is a flow chart showing the process of using a logic controller to activate gates to limit data access in a memory device.

FIG. 35 shows the process of using a logic controller to activate gates to limit data access in a memory device. After the logic controller of a R-CPMD accesses tables for a list of memory cells (3500), the logic controller activates gates at the specific cell locations (3510). The cell gates close access to data storage (3520) and the condition of the memory cells and gates is recorded in lists on tables (3430). As conditions of gates change, the list of memory cell conditions change (3440) and the process continues either to using the logic controller to activate gates at specific cell locations (3510) or until the priority of memory cells are updated by the controller for specific applications (3450).

Figure 36:
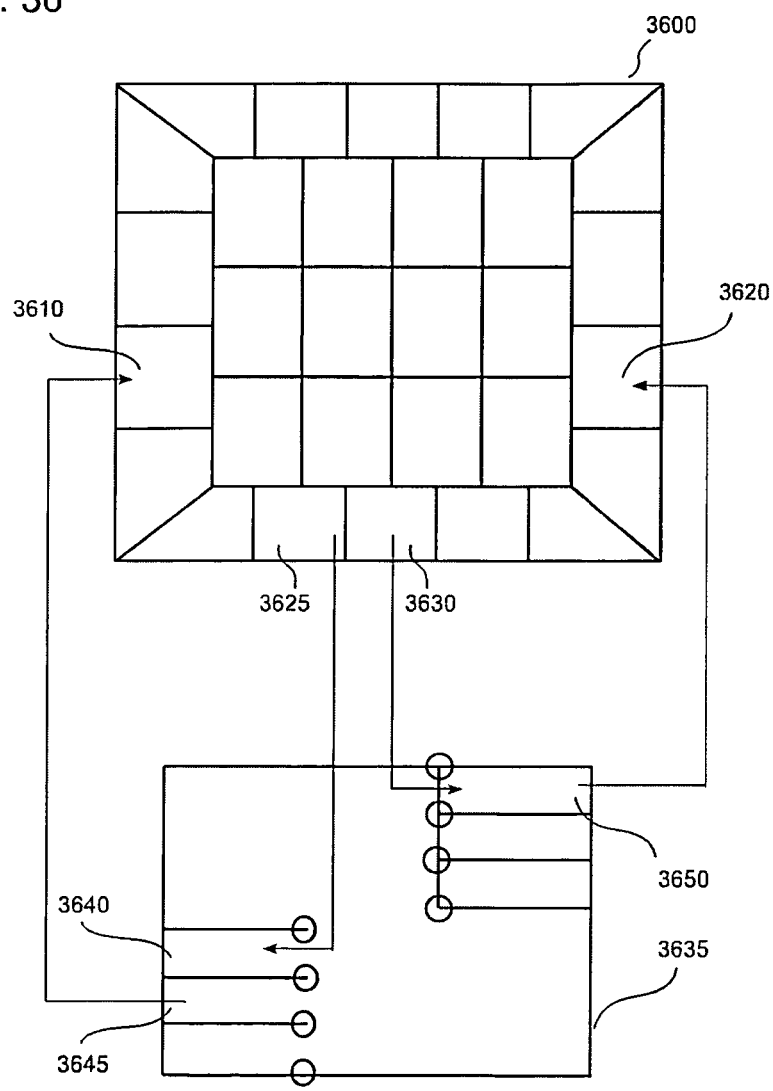
FIG. 36 is a schematic diagram showing an FPGA coupled with an R-CPMD.

FIG. 36 shows an FPGA coupled with an R-CPMD. The FPGA (3600) shows a configuration of gates in the center with SRAM cells on the periphery. The R-CPMD is shown at bottom (3635). The closed section of the R-CPMD (3650) allows access to memory data flows with the FPGA SRAM components at 3620 and 3630. The open section of the R-CPMD in the bottom left allows data to be input from the FPGA SRAM at 3625 into the memory array at 3640. Data are also moved from the memory array at 3645 to the FPGA SRAM at 3610.

Figure 37:
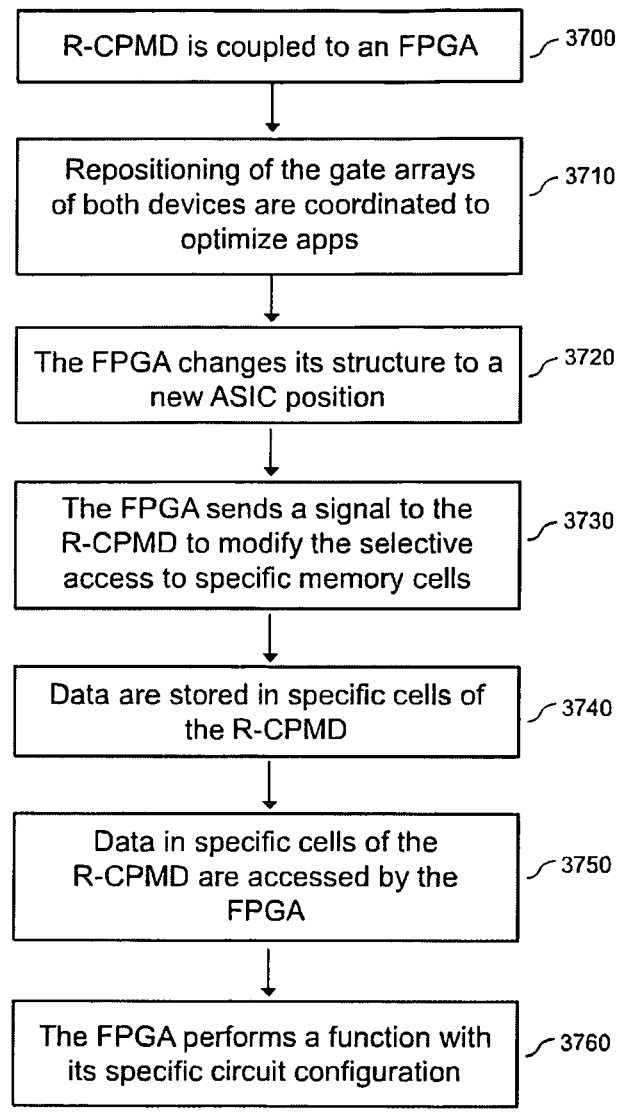
FIG. 37 is a flow chart showing the process of coupling an FPGA with an R-CPMD.

FIG. 37 shows the process of coupling an FPGA with an R-CPMD. After the R-CPMD is coupled to an FPGA (3700), the repositioning of the gate arrays of both devices are coordinated to optimize applications (3710). The FPGA changes its structure to a new ASIC position (3720) and the FPGA sends a signal to the R-CPMD to modify the selective access to specific memory cells (3730). The data are stored in specific cells of the R-CPMD (3740) and data in specific cells of the R-CPMD are accessed by the FPGA (3750). The FPGA then performs a function with its specific circuit configuration (3760).

Figure 38:
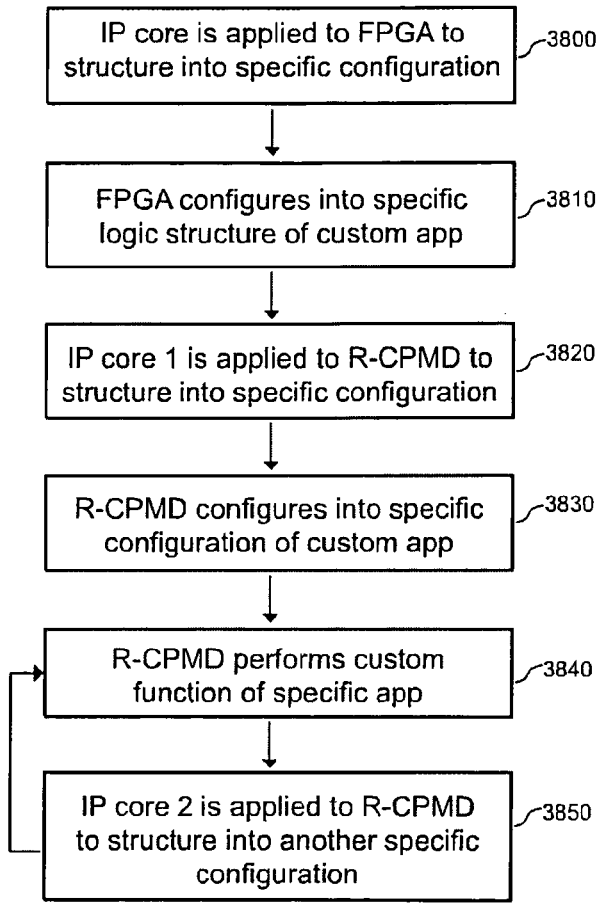
FIG. 38 is a flow chart showing the process of using IP cores with an FPGA and an R-CPMD.

FIG. 38 shows the process of using IP cores with an FPGA and an R-CPMD. IP cores are customized software used to configure configurable circuits. As shown in FIG. 38, once the IP core is applied to the FPGA to structure into a specific configuration (3800), the FPGA configures into a specific logic structure of a custom application (3810). IP core 1 is applied to the R-CPMD to structure into a specific configuration (3820) and the R-CPMD then configures into a specific configuration of a custom application (3830). The R-CPMD performs a custom function of a specific application (3840) and IP core 2 is applied to the R-CPMD to structure into another specific configuration (3850). The R-CPMD performs a custom function of a specific application.

Figure 39:
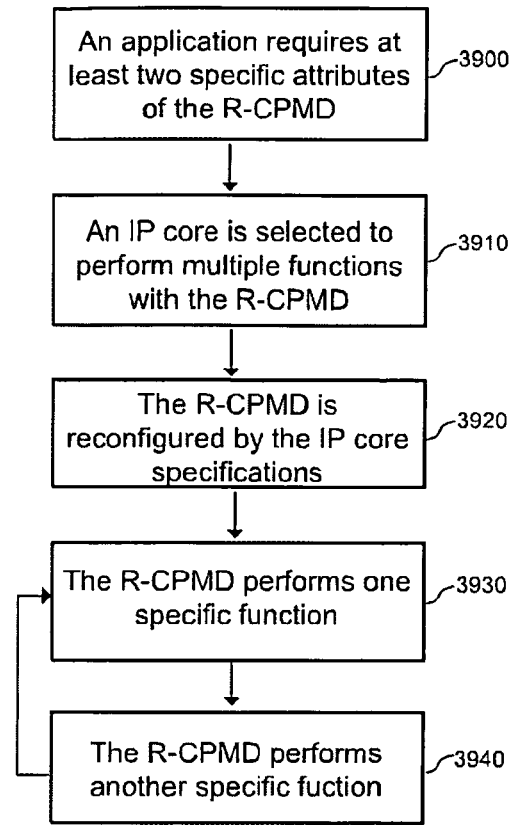
FIG. 39 is a flow chart showing the process of using an IP core to reconfigure an R-CPMD.

FIG. 39 shows the process of using an IP core to reconfigure an R-CPMD. After an application requires at least two specific attributes of the R-CPMD (3900), an IP core is selected to perform multiple functions with the R-CPMD (3910). The R-CPMD is reconfigured by the IP core specification (3920) and the R-CPMD performs one specific function (3930). The R-CPMD performs another specific function (3940) and the process repeats its functional application sequence.

Figure 40:
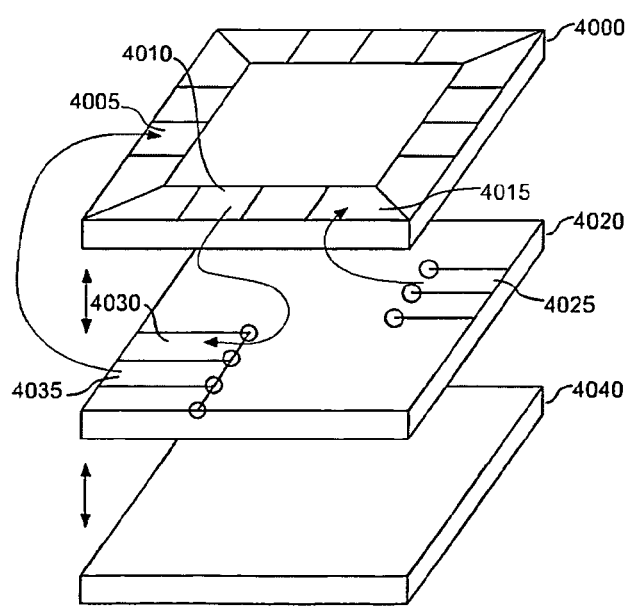
FIG. 40 is a schematic diagram showing a three layer integrated circuit with a CPMD layer in which the top layer is an FPGA that shares SRAMs with the CPMD layer.

FIG. 40 shows a three layer integrated circuit with a CPMD layer in which the top layer is an FPGA that shares SRAMs with the CPMD. The top layer (4000) is an FPGA, the middle layer (4020) is the CPMD and the bottom layer is an unspecified circuit (4040). The memory array in the CPMD at 4025 interacts with the FPGA SRAM component at 4015. The memory array in the CPMD at 4035 is shown with data flowing to the FPGA SRAM component at 4005. The FPGA SRAM component at 4010 is shown with data flowing to the memory array in the CPMD at 4030. Though a three layer 3D integrated circuit is shown, the invention is not limited to three layers.

Figure 41:
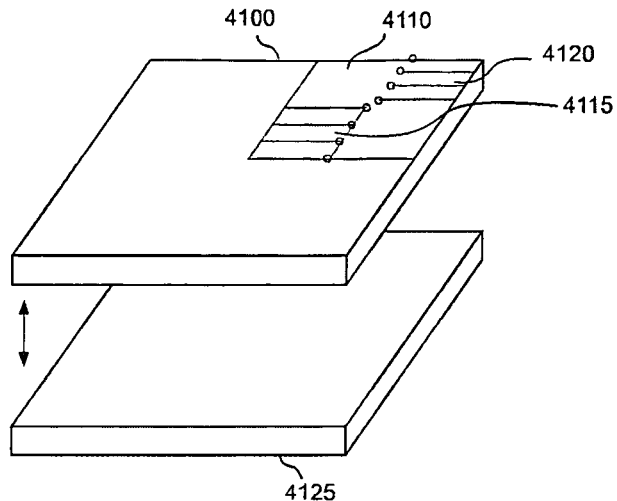
FIG. 41 is a schematic diagram showing a CPMD on a tile of one layer of a 3D SoC.

FIG. 41 shows a CPMD on a tile of one layer of a 3D SoC. The top layer (4100) of the 3D SoC is shown with a single tile on the upper right regions consisting of a CPMD component. The upper right part of the CPMD is shown with gates in the open position (4120) and the lower right part of the CPMD is shown with gates in the closed position (4115). The second layer of the multi-layer chip is shown (4125) as an unspecified circuit.

Figure 42:
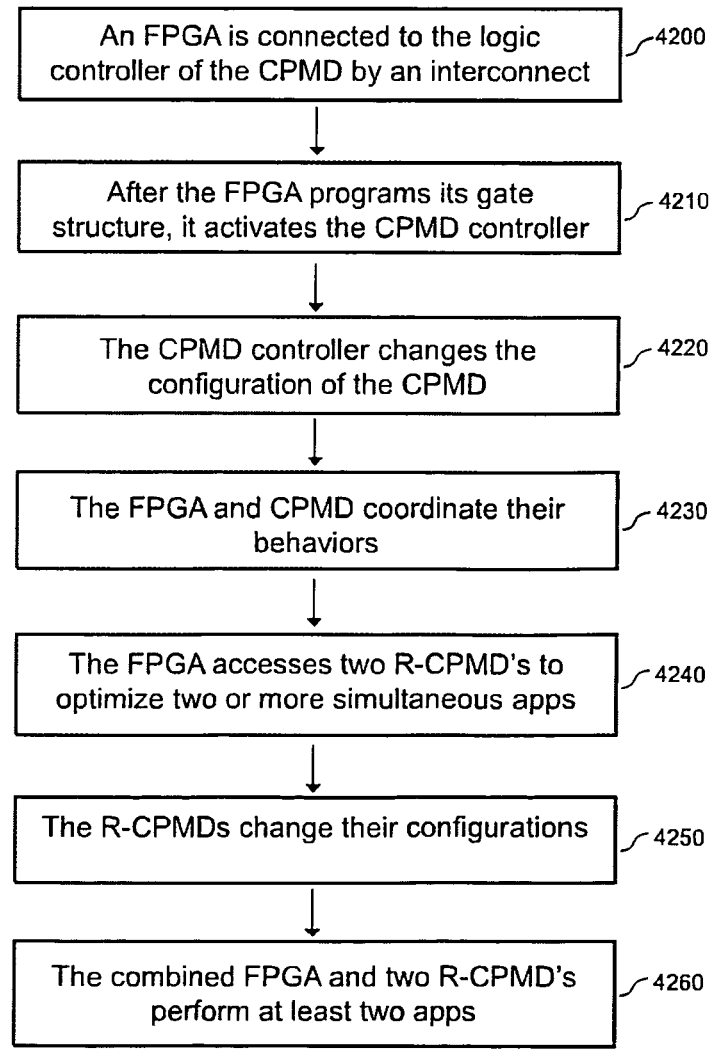
FIG. 42 is a flow chart showing the use of an FPGA with at least one CPMD.

FIG. 42 shows the process of using an FPGA with at least one CPMD. Once an FPGA is connected to the logic controller of the CPMD by an interconnect (4200) and after the FPGA programs its gate structure, it activates the CPMD controller (4210). The CPMD controller then changes the configuration of the CPMD (4220) and the FPGA and CPMD coordinate their behaviors (4230). The FPGA then accesses two R-CPMDs to optimize two or more simultaneous applications (4240) and the R-CPMDs change their configurations (4250). The combined FPGA and two R-CPMDs then perform at least two applications (4260).

Figure 43:
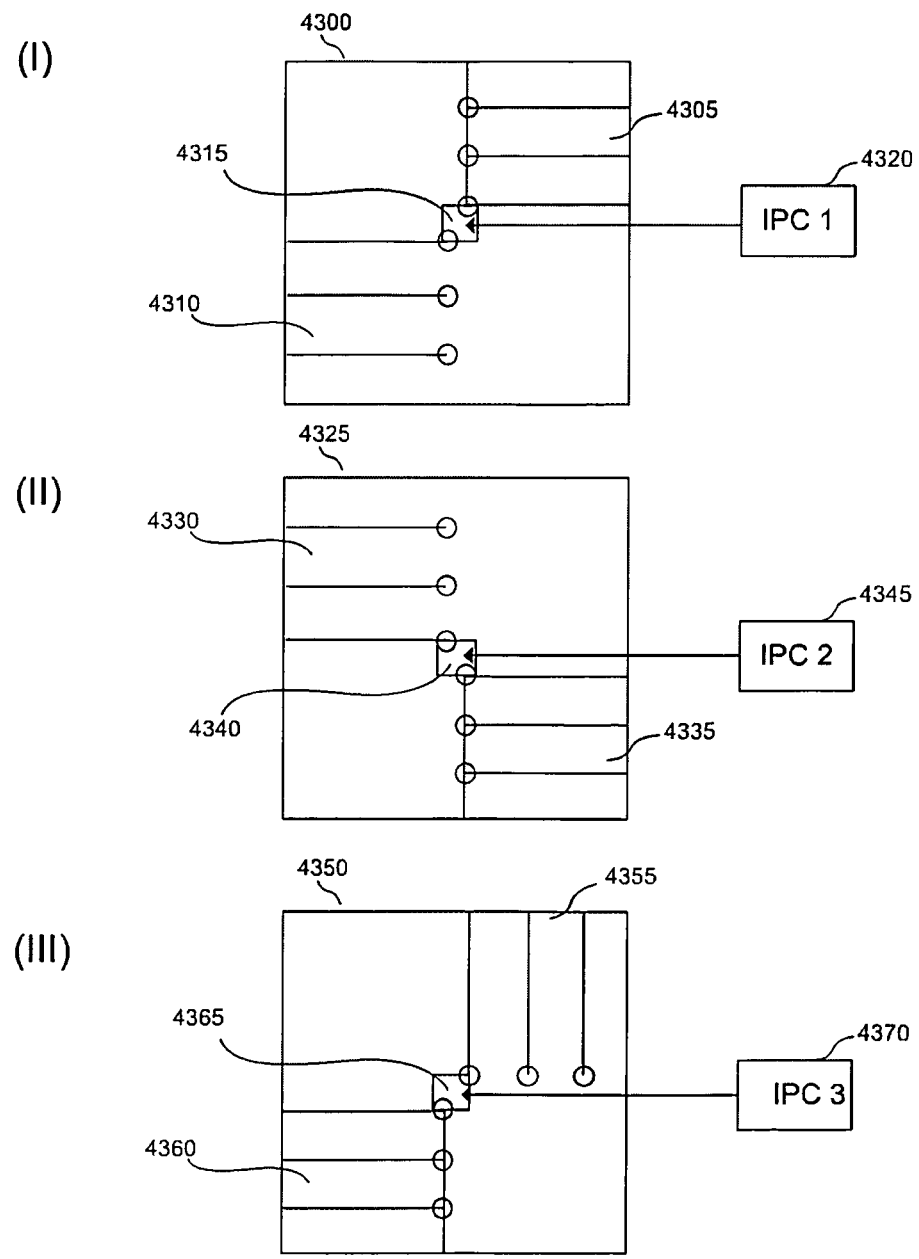
FIG. 43 is a schematic diagram showing IP cores sent to an R-CPMD in three phases of restructuring.

FIG. 43 shows IP cores sent to an R-CPMD in three phases of restructuring. In the first phase, the R-CPMD (4300) is shown receiving IP core #1 (4320) into the logic controller (4315). The controller then activates the gates in the upper right region (4305) while leaving the gates in the lower left region (4310) open. In the second phases, the R-CPMD (4325) is shown receiving IP core #2 (4345) into the logic controller (4340). The controller then activates the gates in lower right region (4335) while leaving the gates in the upper left region (4330) open. In the third phase, the R-CPMD (4350) is shown receiving IP core #3 (4370) into the logic controller (4365). The controller then activates the gates in the lower left region (4360) while leaving the gates in the upper right region (4355) open.

Figure 44:
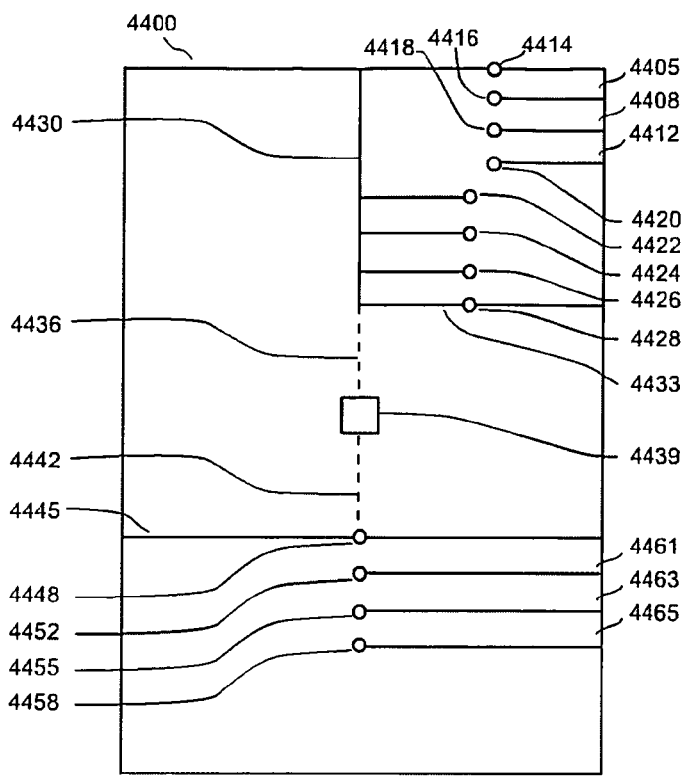
FIG. 44 is a schematic diagram showing an active storage memory circuit configured with a CPMD and an R-CPMD with a common logic controller.

FIG. 44 shows an active storage memory circuit configured with a CPMD and an R-CPMD with a common logic controller. Active storage memory circuits are memory devices with embedded logic controllers. In this figure, the active storage memory circuit (4400) is shown with an R-CPMD component (4430) in the upper right that is configured with closed gates (4414, 4416, 4418 and 4420) to limit storage and access to the memory arrays (4405, 4408 and 4412). The gates are also shown in the open position (4422, 4424, 4426 and 4428). The anterior array is shown at 4433. The logic controller (4439) connects to the CPMD and an R-CPMD with interconnects (4436 and 4442). The CPMD, shown at the bottom right, is configured with closed gates at 4448, 4452, 4455 and 4458. The memory arrays are shown at 4461, 4463 and 4465, with the anterior array shown at 4445.

Figure 45:
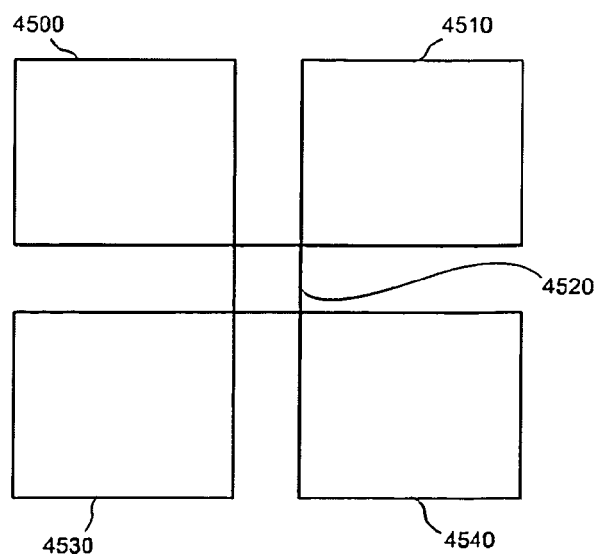
FIG. 45 is a schematic diagram of four CPMDs connected to a central logic controller.

FIG. 45 shows four CPMDs connected to a central logic controller. The memory devices (4500, 4510, 4530 and 4540) are shown connected to the controller (4520).

Figure 46:
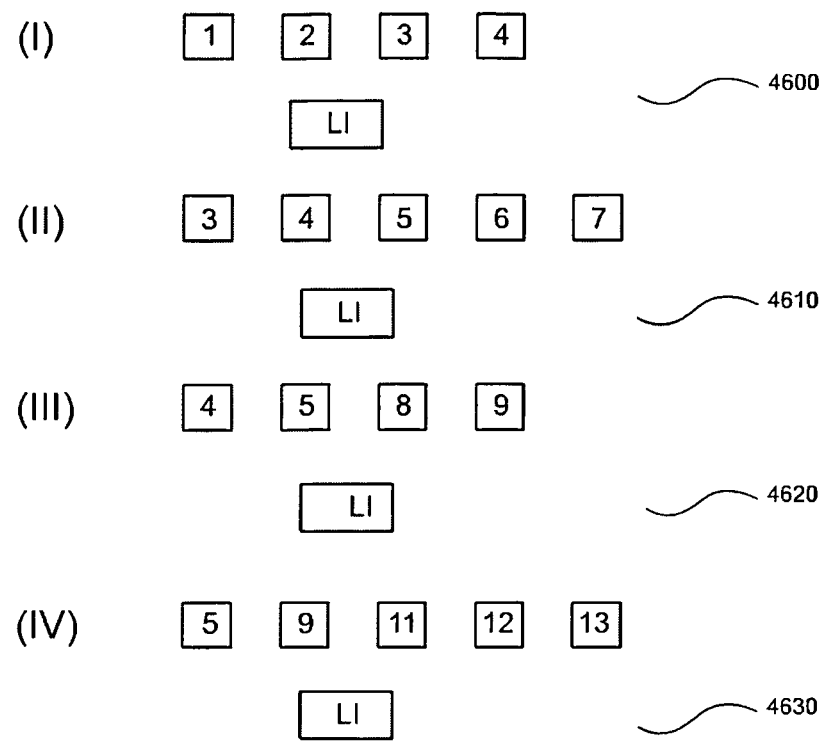
FIG. 46 is a schematic diagram showing the multi-phasal process of successive CPMDs that are reaggregated with a continuous logic device.

FIG. 46 shows the multi-phasal process of successive CPMDs that are reaggregated with a continuous logic device (shown as LI in each phase). In the first phase, the CPMD is organized in positions 1, 2, 3 and 4 (4600). In the second phase, the CPMD is organized to reorder into positions 3, 4, 5, 6 and 7 (4610). In the third phase, the CPMD is organized to reorder into positions 4, 5, 8 and 9 (4620). Finally, in the fourth phase, the CPMD is organized into positions 5, 8, 9, 11, 12 and 13 (4630).

Figure 47:
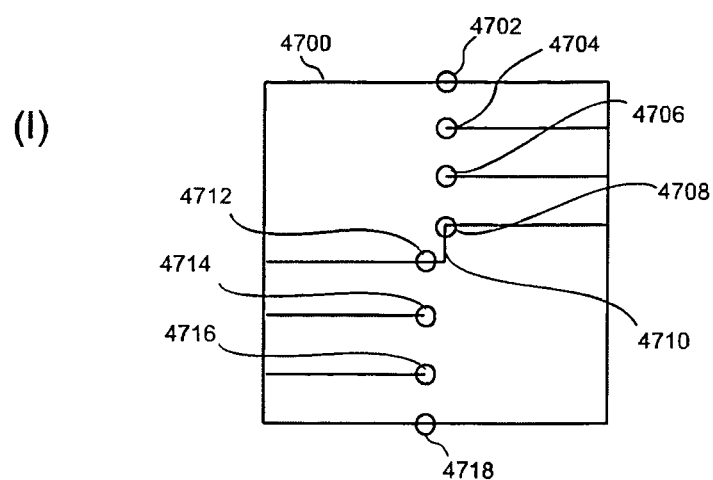
FIG. 47 is a schematic diagram showing a CPMD in two phases with a common bus that reconfigures as the CPMD reconfigures.
Figure 47:
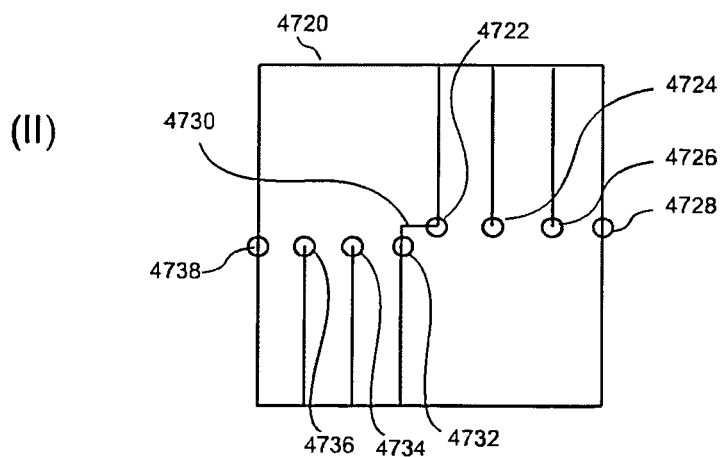

FIG. 47 shows the CPMD in two phases with a common bus that reconfigures as the CPMD reconfigures. In the first phase, the gates in the upper right region (4702, 4704, 4706, 4708 and 4710) and the gates in the lower left region (4712, 4714, 4716 and 4718) of the CPMD (4700) interact with the bus (4720). In the second phase, the gates in the upper left region (4722, 4724, 4726 and 4728) of the CPMD (4720) and the gates in the lower left region (4732, 4734, 4736 and 4738) interact with the bus (4730). In this case the bus is configured to activate alternative sets of gates.

Figure 48:
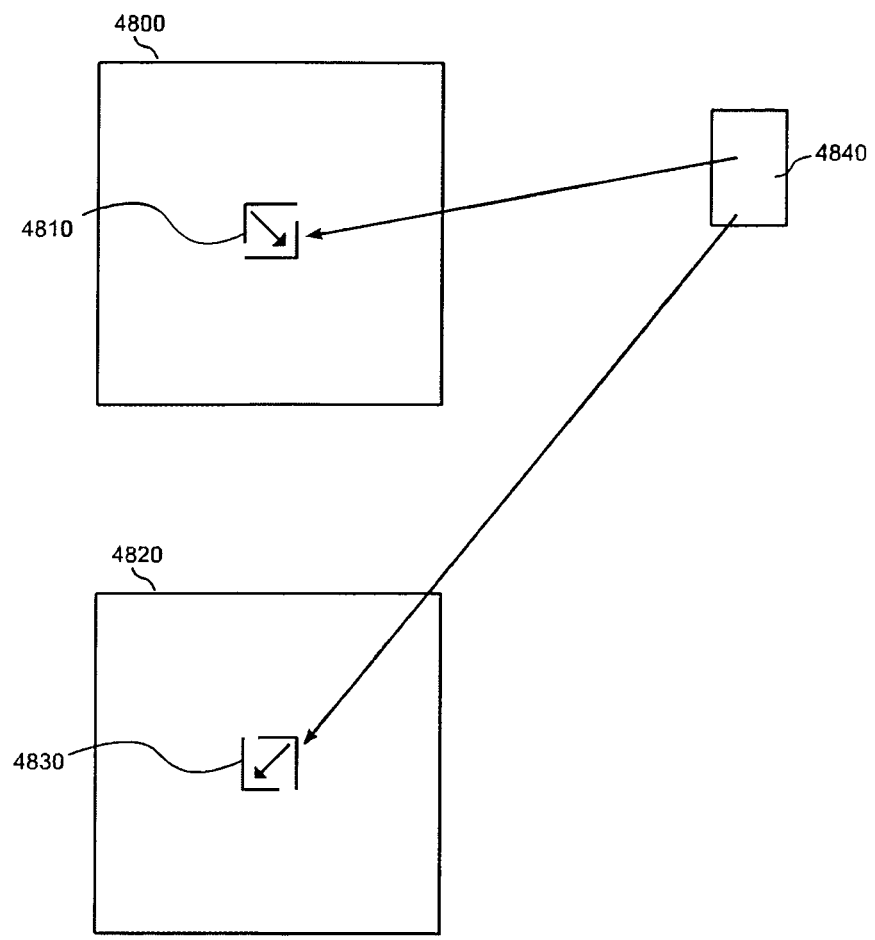
FIG. 48 is a schematic diagram showing two CPMDs' buses in a network restructured by remote activation.

FIG. 48 shows two CPMDs' buses in a network restructured by remote activation. In the top CPMD (4800), the bus is configured (4810) to emphasize the lower right region and in the bottom CPMD (4820), the bus is configured (4830) to emphasize the lower left region. The external device (4840) is configured to send a signal to the two CPMDs to configure their respective buses.

Figure 49:
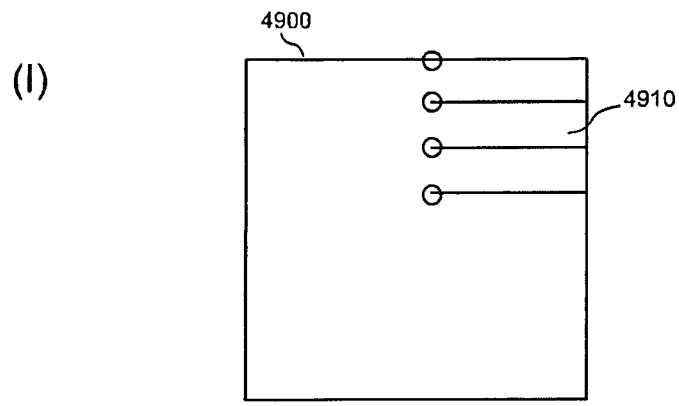
FIG. 49 is a schematic diagram showing the sequential activation and deactivation of a section of an R-CPMD.
Figure 49:
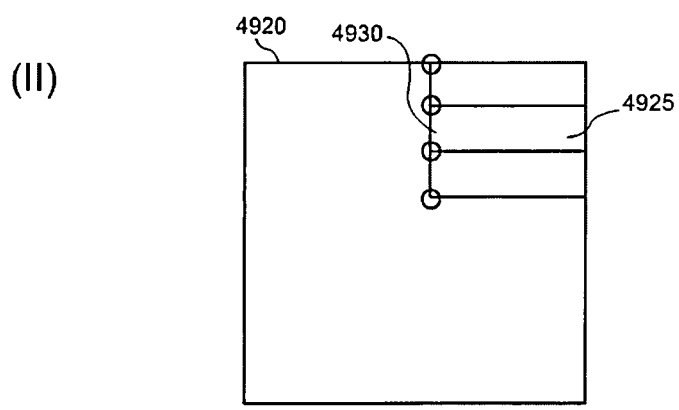
Figure 49:
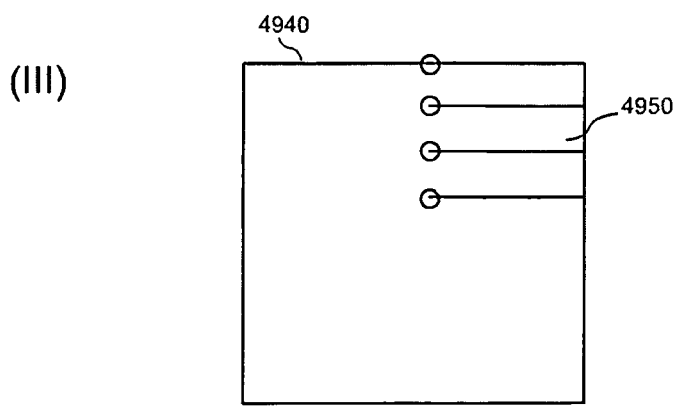

FIG. 49 shows the sequential activation and deactivation of a section of an R-CPMD. In the first phase, the R-CPMD (4900) is configured with open gates in the upper right region (4910). In the second phase, the R-CPMD (4920) is configured with closed gates (4930) at 4925. In the third phase, the R-CPMD (4940) is configured with open gates (4950). This drawing shows the alternating functionality of the gate mechanism.

Figure 50:
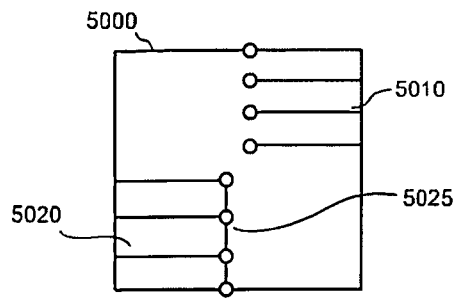
FIG. 50 is a schematic diagram showing the parallel activation and deactivation of different sections of an R-CPMD in three phases.
Figure 50:
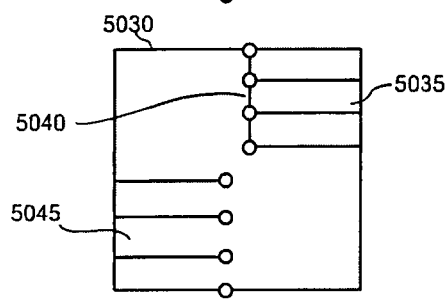
Figure 50:
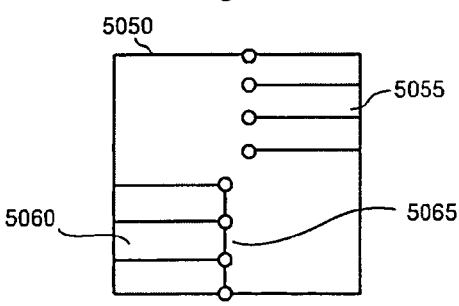

FIG. 50 shows the parallel activation and deactivation of different sections of an R-CPMD in three phases. In phase I, the R-CPMD (5000) is shown with open gates in the upper right region (5010) and closed gates (5025) in the lower left region (5020). In phase two, the R-CPMD (5030) is shown with closed gates (5040) in the upper right region (5035) and open gates in the lower left region (5045). In the third phase, the R-CPMD (5050) is shown with open gates in the upper right region (5055) and closed gates (5065) in the lower left region (5060). In this drawing, the R-CPMD components oscillate between positions over the three phases.

Figure 51:
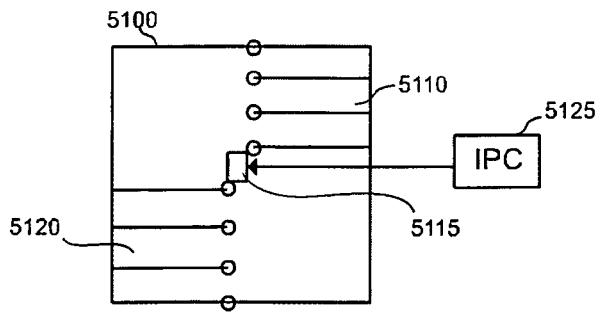
FIG. 51 is a schematic diagram showing the use of an IP core that activates a specific gate in an R-CPMD in two phases.
Figure 51:
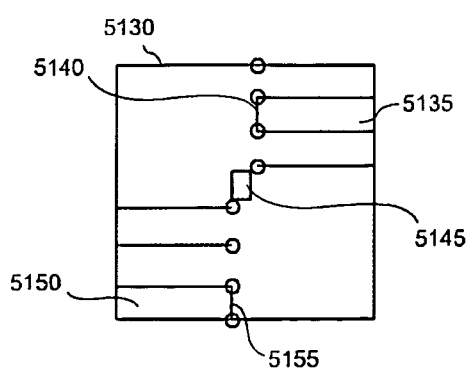

FIG. 51 shows the use of an IP core that activates a specific gate in an R-CPMD in two phases. In the first phase, the IP core (5125) is downloaded to the bus 5115 of the R-CPMD (5100). The open gates in the regions (5110 and 5120) are shown. In the second phase, the R-CPMD (5130) is shown whereby the IP core activates the bus (5145) to activate specific gates (5140 and 5155) to restrict data flow and access at specific memory arrays (5135 and 5150).

Figure 52:
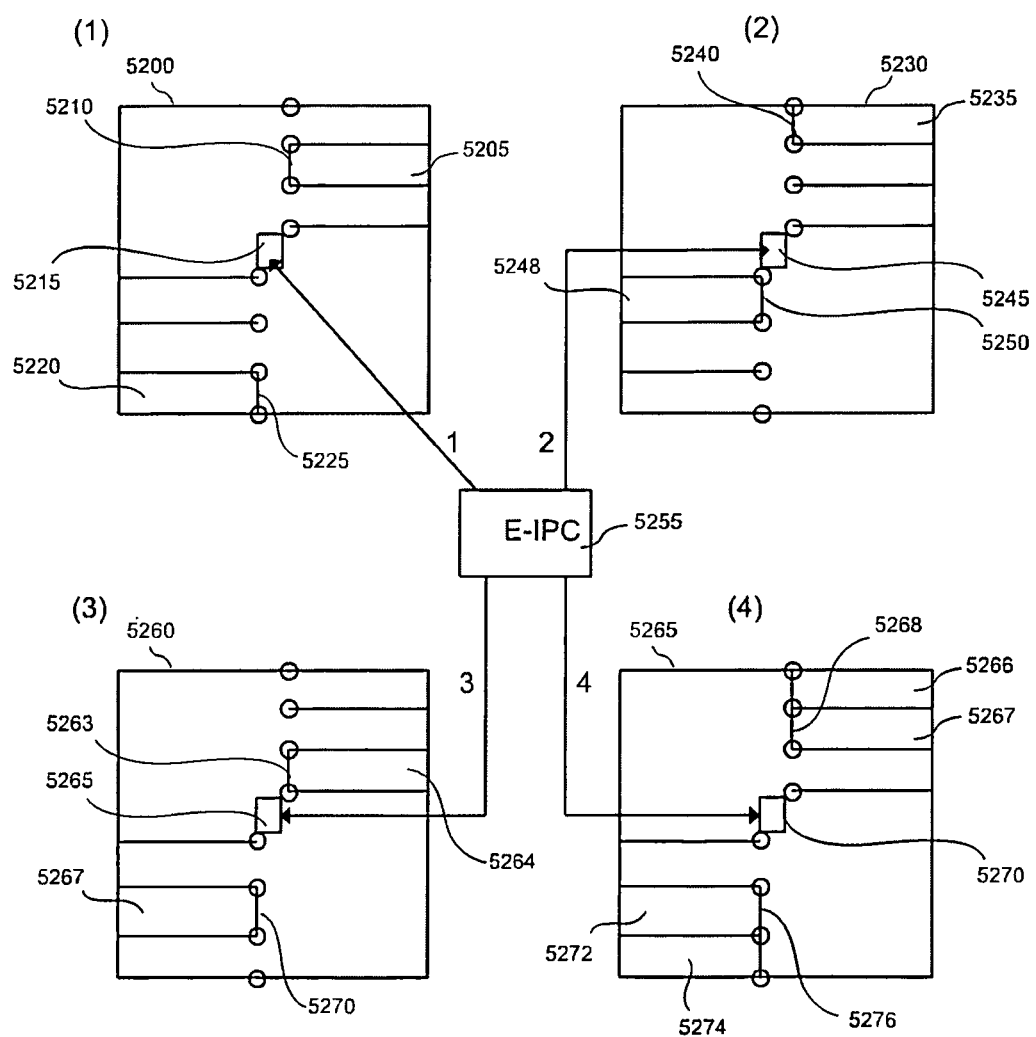
FIG. 52 is a schematic diagram showing an evolutionary IP core providing algorithms to four states of an R-CPMD to modify gate structure.

FIG. 52 shows an evolutionary IP core providing algorithms to four states of an R-CPMD to modify gate structure. In the first state, the R-CPMD (5200) is shown receiving (in phase 1) the evolutionary IP core (5255) at the bus (5215), which then activates the gates at 5210 and 5225 and thereby constrains the access to memory arrays at 5205 and 5220. In the second state, in phase 2, the R-CPMD (5230) is shown receiving the evolutionary IP core (5255) at the bus (5245), which reconfigures the gates at 5240 and 5250 and thereby constrains access to memory arrays at 5235 and 5248. In the third state, the R-CPMD (5260) is shown receiving the evolutionary IP core (5255) at the bus (5265), which then activates the gates at 5263 and 5270 and thereby constrains access to memory arrays at 5264 and 5267. Finally, in the fourth state, the R-CPMD (5265) is shown receiving the evolutionary IP core (5255) at the bus (5270), which reconfigures the gates at 5268 and 5276 and thereby constrains access to memory arrays at 5266, 5267, 5272 and 5274.

Figure 53:
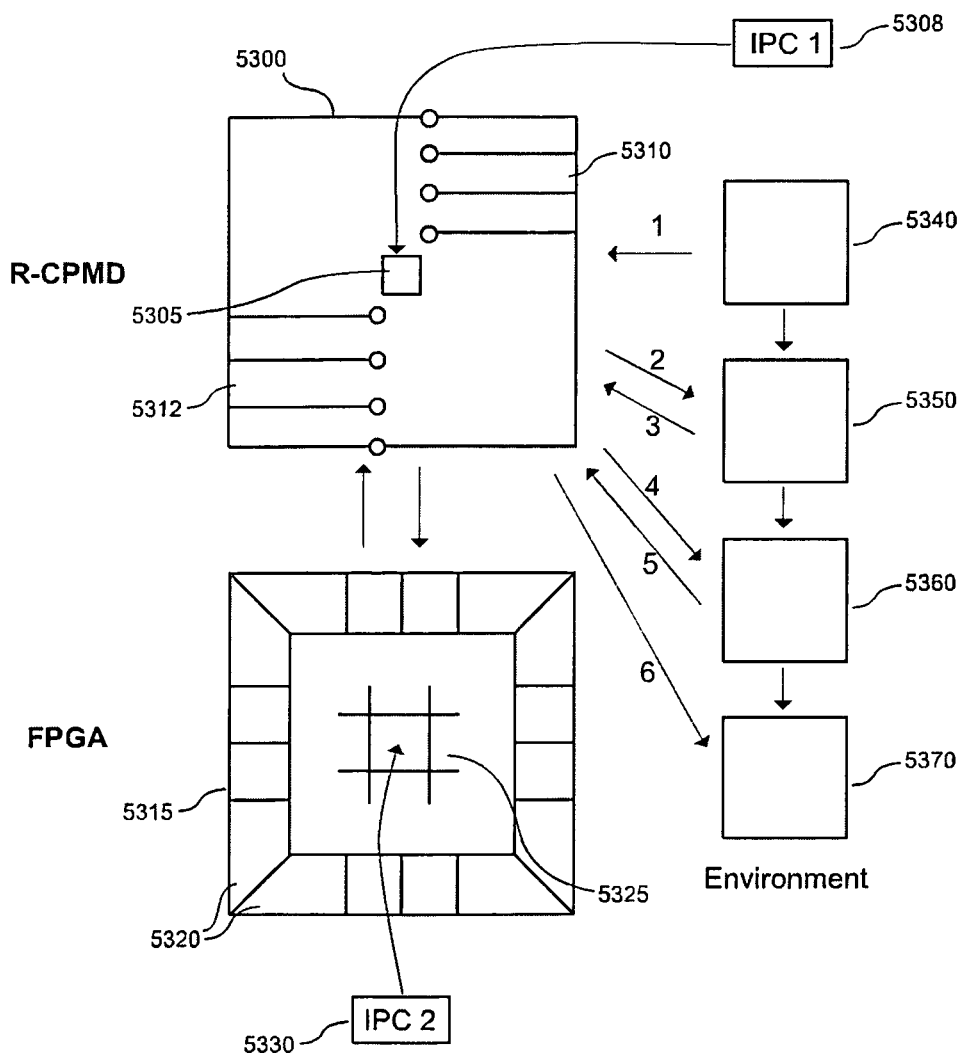
FIG. 53 is a schematic diagram showing the interaction of an R-CPMD and an FPGA in the context of interaction with the environment.

FIG. 53 shows the interaction of an R-CPMD and an FPGA in the context of interaction with the environment. The R-CPMD (5300) is shown receiving IP core 1 (5308) at the bus (5305). The memory arrays are configured at 5310 and 5312. The R-CPMD is shown interacting with the FPGA (5315). The FPGA receives IP core 2 (5330) at the FPGA logic component (5325), which operates by activating SRAM components at 5320. In the first phase of the environment (5340), the R-CPMD (5300) receives inputs and reconfigures. This configuration is then output to the environment at stage two (5350), which provides feedback to the R-CPMD (5300). This configuration is then output to the environment again in its new phase (5360), which provides feedback to the R-CPMD (5300) and the process continues with the last phase of the environment (5370). The FPGA continuously interacts with the R-CPMD during this process.

I claim:

1. A complex programmable memory device comprising:
   memory arrays consisting of a set of memory cells;
   interconnects connecting the memory arrays;
   programmable gates located at junctions of the memory arrays;
   a logic controller;
   wherein the programmable gates are activated by the logic controller to close at a specific set of junctions of the memory arrays;
   wherein the memory arrays store data when the programmable gates are open; and
   wherein the memory arrays limit access to data in a specific region when the programmable gates are closed.

2. The apparatus of claim 1, wherein:
   a combination of programmable gates are activated in a specific configuration;
   the combination of programmable gates are configured to segregate an aggregate region of the memory array;
   the aggregate region of the memory array is delimited by the activation of the combination of programmable gates at a specific set of junctions; and
   the specific region of the memory array limits the access to data.

3. The apparatus of claim 1, wherein:
   wherein the memory arrays send data from one closed off region to an open region of the device.

4. The apparatus of claim 1, wherein:
   the logic controller accesses at least one table to track the configuration of the programmable gates.

5. The apparatus of claim 1, wherein:
   the data are accessed in memory arrays when the programmable gates are open.

6. The apparatus of claim 1, wherein:
   the data are not stored in memory arrays when the programmable gates are closed.

7. A complex reprogrammable memory device comprising:
   memory arrays consisting of a set of memory cells;
   interconnects connecting the memory arrays;
   reprogrammable gates located at junctions of the memory arrays;
   a logic controller;
   wherein the reprogrammable gates are activated by the logic controller to open at a specific set of junctions of the memory arrays in a first phase;
   wherein the reprogrammable gates are activated by the logic controller to close at another specific set of junctions of the memory arrays in subsequent phases; and
   wherein data are stored in the memory arrays in the memory device when the gates are open.

8. The apparatus of claim 7, wherein:
   a combination of reprogrammable gates are activated in a specific sequence;
   the combination of reprogrammable gates are configured to segregate an aggregate region of the memory array in the first phase;
   the aggregate region of the memory array is delimited by the activation of the combination of reprogrammable gates at the specific set of junctions in subsequent phases; and
   the specified region of the memory array limits access to data when the reprogrammable gates are configured to close at the specific set of junctions.

9. The apparatus of claim 7, wherein:
   the data are accessible when the gates are open.

10. The apparatus of claim 7, wherein:
    the data are not stored when the gates are closed.

11. The apparatus of claim 7, wherein:
    the reprogrammable gates are reconfigured in an open position after an initial configuration to provide access to a specific set of memory arrays; and
    data are stored in the specific set of memory arrays when the reprogrammable gates provide access to the memory arrays.

12. The apparatus of claim 7, wherein:
    the logic controller accesses at least one table to track the configuration of the reprogrammable gates.

13. The apparatus of claim 7, wherein:
    the logic controller accesses at least one table to track the specific configurations of the reprogrammable gates in the at least two aggregated regions in the successive phases.

14. A complex reprogrammable memory device comprising:
    memory arrays consisting of a set of memory cells;
    interconnects connecting the memory arrays;
    reprogrammable gates located at junctions of the memory arrays;
    a logic controller;
    wherein the reprogrammable gates are activated by the logic controller to open at least two specific junctions of the memory arrays in an initial phase;
    wherein the reprogrammable gates are activated by the logic controller to close or open at least two specific junctions of the memory arrays in at least two specific configurations of aggregated regions of memory arrays in successive phases;
    wherein the reprogrammable gates are configured to allow access to at least two aggregated regions of memory arrays in different phases; and
    wherein data are stored in the complex reprogrammable memory device when the reprogrammable gates are open.

15. The apparatus of claim 14, wherein:
    a combination of reprogrammable gates are activated in a sequence;
    the unique combination of reprogrammable gates are activated at the at least two specific junctions of the memory arrays to segregate at least two aggregated regions of the memory arrays in multiple phases; and
    the at least two regions of memory arrays are limited in the access to data when the reprogrammable gates at the at least two specific junctions of the memory array are closed.

16. The apparatus of claim 14, wherein:
    the data are accessible in the at least two aggregated regions of the memory arrays when the reprogrammable gates are open.

17. The apparatus of claim 14, wherein:
    the reprogrammable gates are reconfigured in at least two specific aggregate regions of memory arrays after an initial configuration; and
    data are stored in the at least two aggregated regions of the memory arrays in successive configurations when the reprogrammable gates are configured in an open position to provide the access to the memory arrays.

* * * * *